United States Patent
So et al.

(10) Patent No.: US 10,497,334 B2
(45) Date of Patent: Dec. 3, 2019

(54) DISPLAY DEVICE AND GATE DRIVER CIRCUIT

(71) Applicant: LG DISPLAY CO., LTD., Seoul (KR)

(72) Inventors: Byeongseong So, Goyang-si (KR); Jiah Kim, Goyang-si (KR)

(73) Assignee: LG Display Co., Ltd, Seoul (KR)

( * ) Notice: Subject to any disclaimer, the term of this patent is extended or adjusted under 35 U.S.C. 154(b) by 205 days.

(21) Appl. No.: 15/660,758

(22) Filed: Jul. 26, 2017

(65) Prior Publication Data

US 2018/0033391 A1 Feb. 1, 2018

(30) Foreign Application Priority Data

Jul. 28, 2016 (KR) .................. 10-2016-0095964

(51) Int. Cl.
*G09G 3/20* (2006.01)
*G09G 3/36* (2006.01)
*H01L 51/50* (2006.01)
*H01L 27/118* (2006.01)

(52) U.S. Cl.
CPC ............ *G09G 3/3696* (2013.01); *G09G 3/20* (2013.01); *G09G 3/3677* (2013.01); *H01L 51/50* (2013.01); *G09G 2300/0408* (2013.01); *G09G 2310/0218* (2013.01); *G09G 2310/0267* (2013.01); *G09G 2310/0281* (2013.01); *G09G 2310/0283* (2013.01); *G09G 2310/0286* (2013.01); *G09G 2310/08* (2013.01); *H01L 27/11898* (2013.01)

(58) Field of Classification Search
CPC ...... G09G 3/3696; G09G 3/20; G09G 3/3677; G09G 2310/08; G09G 2310/0286; G09G 2310/0283; G09G 2310/0281; G09G 2310/0267; G09G 2310/0218; G09G 2300/0408; H01L 51/50; H01L 27/11898
See application file for complete search history.

(56) References Cited

U.S. PATENT DOCUMENTS

2013/0241814 A1* 9/2013 Hirabayashi ......... G09G 3/3677
345/100
2013/0314360 A1* 11/2013 Saitoh .................. G06F 3/0412
345/173

(Continued)

FOREIGN PATENT DOCUMENTS

| KR | 2012 0067250 A | 6/2012 |
| KR | 2014 0076054 A | 6/2014 |
| KR | 2014 0131798 A | 11/2014 |

*Primary Examiner* — Carolyn R Edwards
(74) *Attorney, Agent, or Firm* — Seed Intellectual Property Law Group LLP

(57) ABSTRACT

A display device is provided that includes a display panel divided into a plurality of blocks, each of the blocks including a plurality of lines of pixels and configured to be driven in a time-division manner with a touch sensing period interposed between two display periods, the two display periods corresponding to display periods for two adjacent blocks of the plurality of blocks. The display device further includes a display driving circuit, and a touch sensing unit configured to receive a sync signal for synchronizing the display driving circuit with the touch sensing unit. The display device is configured to change the sync signal every predetermined period of time so as to shift the touch sensing period interposed between the two display periods.

16 Claims, 18 Drawing Sheets

(56) References Cited

U.S. PATENT DOCUMENTS

| | | | | |
|---|---|---|---|---|
| 2014/0049486 A1* | 2/2014 | Kim | ........................ | G06F 3/041 |
| | | | | 345/173 |
| 2014/0049508 A1* | 2/2014 | Kim | ........................ | G06F 3/044 |
| | | | | 345/174 |
| 2014/0111446 A1* | 4/2014 | Lee | ........................ | G06F 3/0416 |
| | | | | 345/173 |
| 2014/0160067 A1* | 6/2014 | Kim | ........................ | G06F 3/0416 |
| | | | | 345/174 |
| 2015/0355767 A1* | 12/2015 | Abe | ........................ | G06F 3/0412 |
| | | | | 345/174 |
| 2015/0378509 A1* | 12/2015 | Choi | ........................ | G06F 3/0416 |
| | | | | 345/173 |
| 2016/0034097 A1 | 2/2016 | Chae | | |
| 2016/0274713 A1* | 9/2016 | Zhang | ........................ | G06F 3/041 |
| 2016/0342262 A1* | 11/2016 | Qian | ........................ | G06F 3/0416 |
| 2017/0235392 A1* | 8/2017 | Ishii | ........................ | G06F 3/0416 |
| | | | | 345/174 |
| 2018/0108291 A1* | 4/2018 | Hao | ........................ | G11C 19/28 |

\* cited by examiner

DISPLAY DEVICE AND GATE DRIVER CIRCUIT

This application claims the benefit of Korean Patent Application No. 10-2016-0095964 filed on Jul. 28, 2016, the entire contents of which is incorporated herein by reference for all purposes as if fully set forth herein.

BACKGROUND

Technical Field

The present disclosure relates to a display device, in which touch sensors and pixels are embedded in a display panel, and a gate driver circuit of the display device.

Description of the Related Art

User interfaces (UIs) are configured to allow users to communicate with various electronic devices and to easily and comfortably control the electronic devices as they desire. Examples of UIs include a keypad, a keyboard, a mouse, an on-screen display (OSD), and a remote controller having an infrared communication function or a radio frequency (RF) communication function. User interface technology has continuously expanded to increase user's sensibility and handling convenience. UIs have been recently developed to include touch UIs, voice recognition UIs, 3D UIs, and the like.

A touch UI senses a touch input using a touch screen implemented on a display panel and transmits the touch input to an electronic device. The touch UI has been adopted in portable information devices, such as smart phones, and use of the touch UI has been expanded to include uses in computer monitors and home appliances.

A technology for implementing a touch screen has been recently applied to various display devices using a technology (hereinafter referred to as "in-cell touch sensor technology") for embedding touch sensors in a pixel array of a display panel. The touch sensors may be implemented as capacitive touch sensors sensing a touch input based on changes in a capacitance before and after the touch input.

In in-cell touch sensor technology, touch sensors may be installed in a display panel without an increase in a thickness of the display panel. As shown in FIG. 1, in the in-cell touch sensor technology, a common electrode for supplying a common voltage Vcom to pixels of a liquid crystal display may be divided to form touch sensor electrodes (including, for example, touch sensor electrodes C1 to C4 shown in FIG. 1). The touch sensor electrodes (including, e.g., C1 to C4) are connected to sensor lines SL. Because touch sensors Cs are embedded in a pixel array of a display panel, the touch sensors Cs are coupled with pixels through parasitic capacitances. In order to reduce signal interference (e.g., crosstalk) attributable to coupling between the pixels and the touch sensors Cs in the in-cell touch sensor technology, one frame period is time-divided into a display period and a touch sensing period. The in-cell touch sensor technology supplies a reference voltage (i.e., the common voltage Vcom) of the pixel to the touch sensor electrodes (including, e.g., C1 to C4) during the display period and drives the touch sensors Cs and senses a touch input during the touch sensing period.

A display device includes a data driver supplying a data voltage to data lines of a display panel, a gate driver (also referred to as a gate driver circuit or a scan driver) supplying a gate pulse (also referred to as a scan pulse) to gate lines of the display panel, and a touch sensing unit (also referred to as a touch sensing circuit or a touch driver circuit) driving touch sensors.

The gate driver sequentially shifts the gate pulse applied to the gate lines using a shift register. The gate pulse is synchronized with the data voltage (i.e., a pixel voltage) of an input image and sequentially selects respective pixels to be charged with the data voltage. The shift register includes cascade-connected stages. The stages of the shift register receive a start signal or a carry signal received from a previous stage as the start signal, and generate an output when a clock is input.

A screen of the display device may be divided into two or more blocks, and a touch sensing period may be allocated between a driving time of one block and a driving time of another block. For example, during a first display period, pixels of a first block may be driven, and data of the first block may be updated to current frame data. During a touch sensing period following the first display period, a touch input may be sensed. During a second display period following the touch sensing period, pixels of a second block may be driven, and data of the second block may be updated to current frame data. However, such a method may deteriorate output characteristic of the gate pulse supplied to the gate lines, and as a result, lead to a reduction in image quality of the display device.

For example, in the second block driven immediately after the touch sensing period, a voltage of a Q node at a stage of a shift register outputting a first gate pulse may be discharged during the touch sensing period due to a leakage current. Because the Q node of the stage is connected to a gate of a pull-up transistor, a decrease in the voltage of the Q node may be generated and may make a bootstrapping operation of turning on the pull-up transistor incomplete. Hence, the gate pulse, of which a voltage rises due to the pull-up transistor, does not rise to a normal voltage level. As a result, a luminance of pixels arranged on a first line of the second block may be reduced due to a decrease in a voltage of the first gate pulse generated when the pixels of the second block start to be driven, and a reduction in the image quality, such as a line dim, may appear. In the shift register, in which an output of a previous stage as a carry signal is input to a start signal input terminal of a next stage, a reduction in output characteristic of the stage generating the first gate pulse after the touch sensing period leads to a decrease in voltages of all of gate pulses generated after the first gate pulse. Further, there is no gate pulse generated after the first gate pulse.

In the in-cell touch sensor technology, a touch sensing period and a display period following the touch sensing period are fixed in every frame period. Because of this, a position of a stage, of which a Q node is charged during the touch sensing period, is always the same at the shift register of the gate driver. In each stage of the shift register, a gate of a pull-up transistor is connected to a Q node. As a result, a pull-up transistor connected to a Q node in stages of the shift register, each of which temporarily stops to operating due to the touch sensing period, receives more DC gate bias stress than pull-up transistors of other stages. In a transistor of a metal oxide semiconductor field effect transistor (MOSFET) structure, the DC gate bias stress deteriorates the transistor, leading to a change in a threshold voltage or output characteristic of the transistor.

When one frame period is time-divided into a display period and a touch sensing period in a display device including in-cell touch sensors, a line dim phenomenon, in which lines are visible at a particular position of the screen, may be generated. In the display device including the in-cell touch sensors, a shift register outputting a gate pulse maintains a Q node in a charged state during the touch sensing period. Hence, the DC gate bias stress of pull-up transistors increases. The reliability of the shift register is reduced due to the DC gate bias stress, and lifespan of the shift register is shortened.

BRIEF SUMMARY

The present disclosure provides a display device employing in-cell touch sensor technology and a gate driver circuit of the display device capable of improving image quality, increasing reliability of a shift register, and increasing lifespan of the shift register.

Various embodiments provide a display device comprising: a display panel divided into a plurality of blocks, each of the blocks including a plurality of lines of pixels and configured to be driven in a time-division manner with a touch sensing period interposed between two display periods, the two display periods corresponding to display periods for two adjacent blocks of the plurality of blocks; a display driving circuit; and a touch sensing unit configured to receive a sync signal for synchronizing the display driving circuit with the touch sensing unit, wherein the display device is configured to change the sync signal every predetermined period of time so as to shift the touch sensing period interposed between the two display periods.

Various embodiments provide a display device comprising: a display panel including pixels connected to data lines and gate lines and time-division driven in a plurality of blocks and a plurality of touch sensors connected to the pixels; a display driving circuit configured to write data of an input image to the pixels in first and second display periods which are separated from each other by a touch sensing period interposed therebetween in one frame period; and a touch sensing unit configured to drive the touch sensors in the touch sensing period, in response to a sync signal, and sense a touch input. The touch sensing period and the second display period following the touch sensing period are changed every predetermined period of time.

In one or more embodiments, the display device further includes a timing controller configured to generate the sync signal and supply the sync signal to the touch sensing unit.

In one or more embodiments, the predetermined period of time is one frame period.

In one or more embodiments, each frame period includes a touch sensing period interposed between two display periods, a beginning of the touch sensing period of a second frame period that follows a first frame period is shifted to a later point in time compared to a beginning of the touch sensing period in the first frame period, and a beginning of the touch sensing period of a third frame period that follows the second frame period corresponds to the beginning of the touch sensing period in the first frame period.

In one or more embodiments, in a second frame period following a first frame period, a beginning of the touch sensing period is shifted to a later point in time compared to a beginning of the touch sensing period in the first frame period, and, in a third frame period following the second frame period, a beginning of the touch sensing period is shifted to a later point in time compared to the beginning of the touch sensing period in the second frame period.

In one or more embodiments, as a result of the changing of the sync signal, a boundary between the adjacent blocks of the plurality of blocks is changed every predetermined period of time.

In one or more embodiments, the display device further comprises a timing controller configured to define the display periods and the touch sensing period and generate the sync signal.

In one or more embodiments, the display device further comprises a plurality of touch sensors, wherein the touch sensing unit is configured to drive the touch sensors in response to the sync signal during the touch sensing period.

In one or more embodiments, the display driving circuit comprises a gate driver comprising a shift register configured to receive a start signal and a shift clock and sequentially output gate pulses to gate lines of the display device.

In one or more embodiments, the shift register comprises a plurality of stages, each stage comprising a pull-up transistor, a pull-down transistor, a first control node configured to control the pull-up transistor, a second control node configured to control the pull-down transistor, and a controller configured to control the charge and the discharge of the first control node and the second control node.

In one or more embodiments, each stage is configured to pre-charge the first control node in response to a start signal input to a start signal input terminal of the stage or a carry signal received from a previous stage, and to increase a voltage of an output terminal of the stage to a gate high voltage when a shift clock is input, thereby starting to output a gate pulse.

In one or more embodiments, as a result of the changing of the sync signal, a position of a stage, of which the first control node is charged during the touch sensing period, is changed every predetermined period of time.

In one or more embodiments, each stage comprises a discharge blocking circuit configured to charge a discharge blocking node positioned in a discharge path of the first control node during a charge period of the first control node to block the discharge path of the first control node and discharge the discharge blocking node during a discharge period of the first control node to form the discharge path of the first control node.

In yet another embodiment, the present disclosure provides a method of driving a display device, the display device comprising a display panel divided into a plurality of blocks each including a plurality of lines of pixels, a display driving circuit, and a touch sensing unit, the method comprising: driving the plurality of blocks in a time-division manner with a touch sensing period interposed between two display periods, the two display periods corresponding to display periods for two adjacent blocks of the plurality of blocks; receiving, by the touch sensing unit, a sync signal for synchronizing the display driving circuit with the touch sensing unit; and changing the sync signal every predetermined period of time so as to shift the touch sensing period interposed between the two display periods.

In one or more embodiments, the method further comprises charging a discharge blocking node positioned in a discharge path of the first control node during a charge period of the first control node to block the discharge path of the first control node, and discharging the discharge blocking node during a discharge period of the first control node to form the discharge path of the first control node.

Embodiments described herein for the display device may similarly apply to the method of driving a display device, and vice versa.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure.

A display device according to embodiments herein may be implemented as a flat panel display, such as a liquid crystal display (LCD) or an organic light emitting diode (OLED) display. In the following description, embodiments will be described using a liquid crystal display as an example of a flat panel display. However, embodiments are not limited thereto, and other types of flat panel displays may be used. For example, a display device according to embodiments herein may be implemented as any display device to which in-cell touch sensor technology is applicable and a gate driver circuit is required.

Switching elements of a gate driver circuit according to embodiments may be implemented as transistors of n-type or p-type metal oxide semiconductor field effect transistor (MOSFET) structure. In embodiments disclosed herein, n-type transistors are described by way of example. However, embodiments are not limited thereto, and other types of transistors may be used. The transistor is a three-electrode element including a gate, a source, and a drain. The source is an electrode for supplying carriers to the transistor. The carriers inside the transistor begin to flow from the source. The drain is an electrode from which the carriers exit the transistor. Namely, carriers in the MOSFET flow from the source to the drain. In case of an n-type MOSFET (NMOS), because carriers are electrons, a source voltage is less than a drain voltage so that electrons can flow from a source to a drain. In the n-type MOSFET, because electrons flow from the source to the drain, a current flows from the drain to the source. In case of a p-type MOSFET (PMOS), because carriers are holes, a source voltage is greater than a drain voltage so that holes can flow from a source to a drain. In the p-type MOSFET, because holes flow from the source to the drain, a current flows from the source to the drain. In embodiments disclosed herein, the source and the drain of the MOSFET are not fixed. For example, the source and the drain of the MOSFET may be changed depending on an applied voltage. The following embodiments are limited to the source and the drain of the transistor.

A touch sensor according to embodiments may be implemented as a capacitive touch sensor, for example, a mutual capacitance touch sensor or a self-capacitance touch sensor, which is able to be embedded in a pixel array. In the following description, embodiments will be described using a self-capacitance touch sensor as an example. However, embodiments are not limited thereto, and other types of touch sensors may be used.

Figure 1:
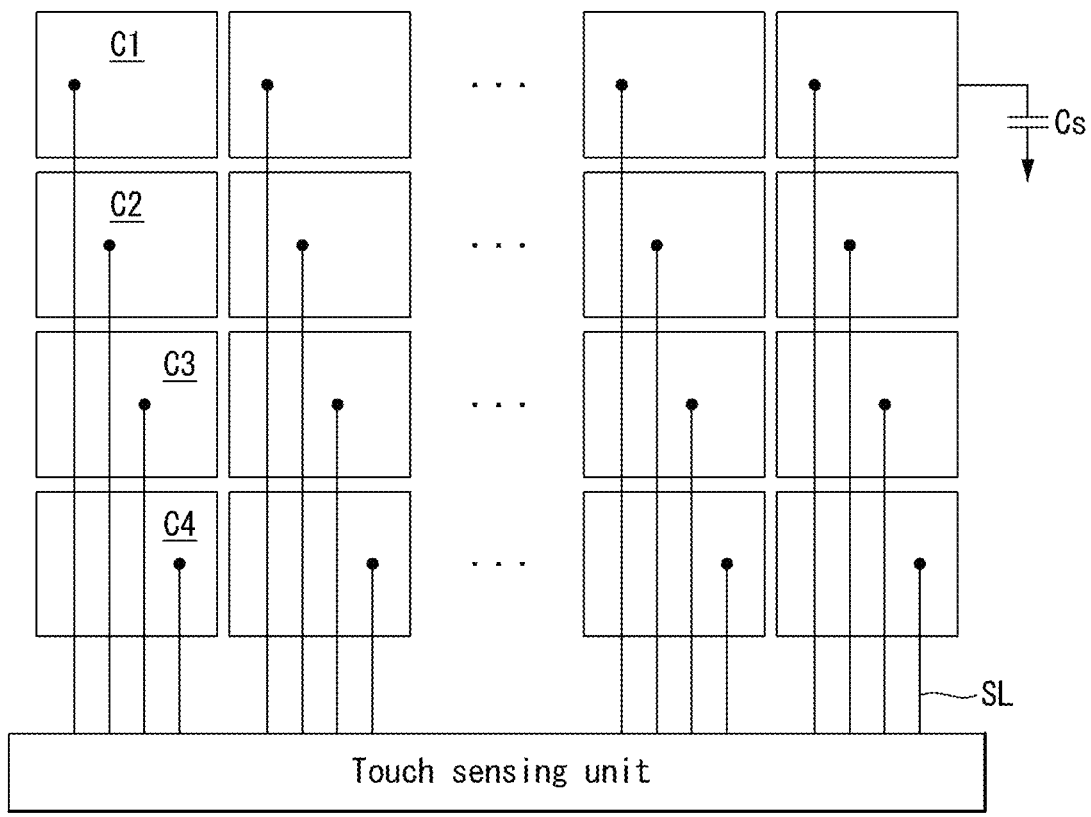
FIG. 1 is a plan view illustrating a pattern of touch sensor electrodes and a touch sensing unit according to a related art.
Figure 2:
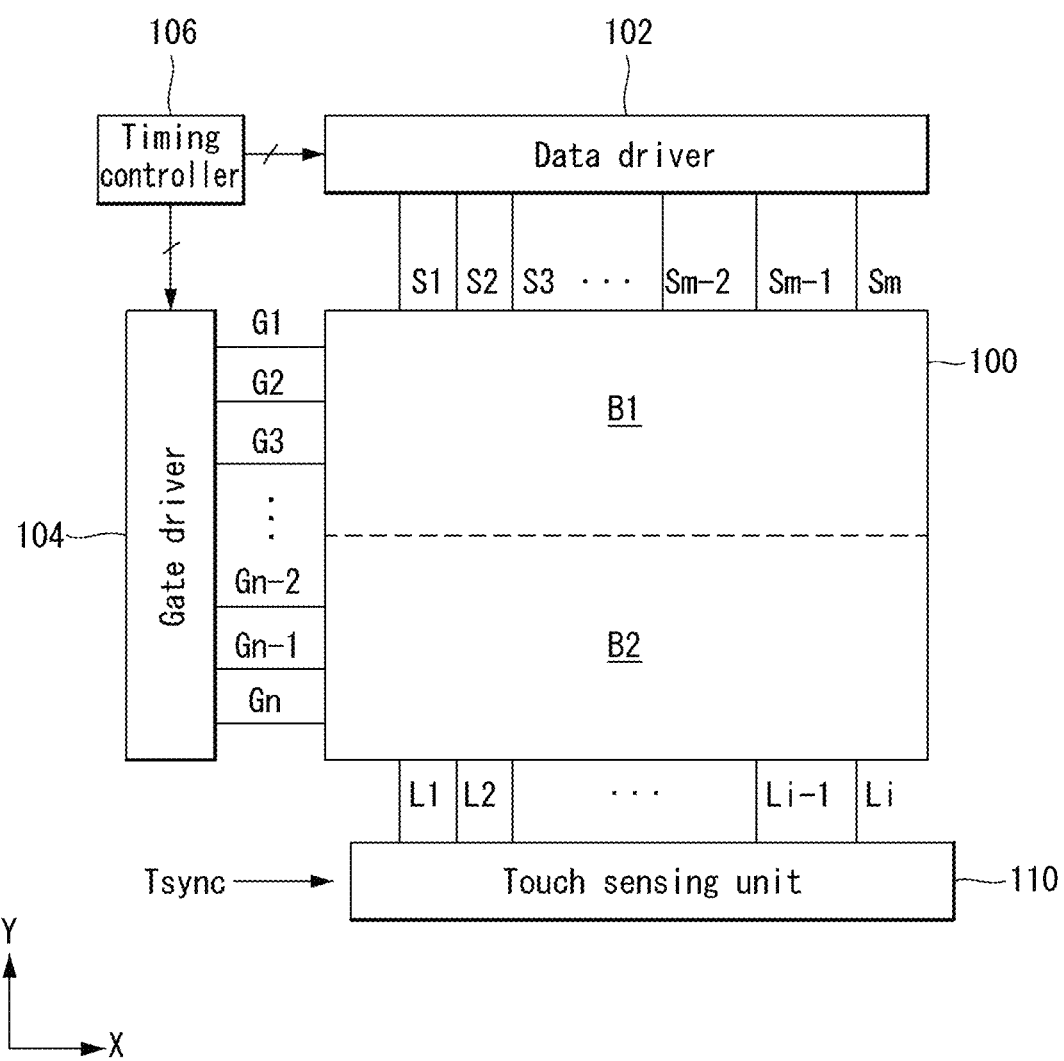
FIGS. 2 and 3 are block diagrams of a display device according to embodiments of the present disclosure.
Figure 3:
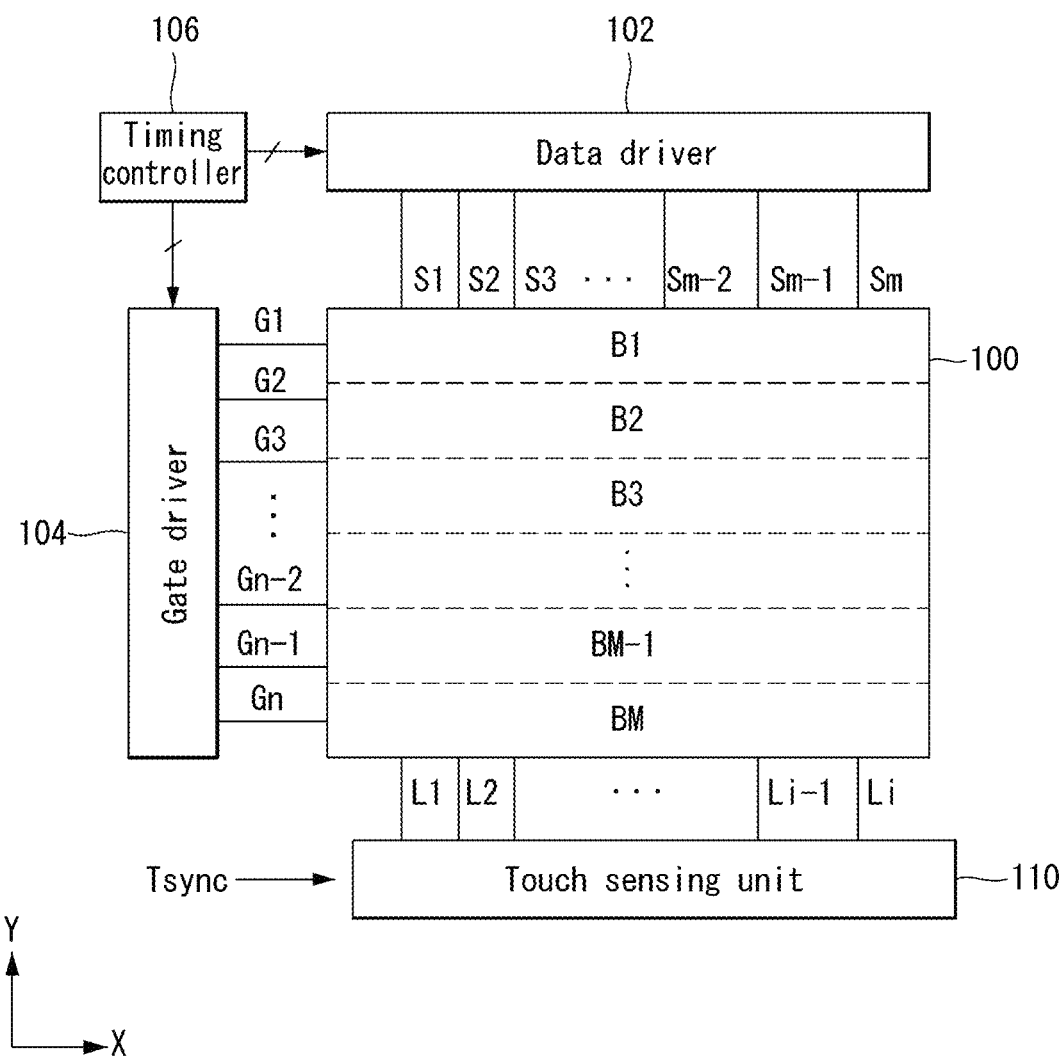

Referring to FIGS. 2 and 3, a display device according to an embodiment includes a display panel 100, a display driving circuit, and a touch sensing unit 110.

One frame period of the display panel 100 may be time-divided into one or more display periods and one or more touch sensing periods, in order to drive in-cell touch sensors and pixels 11 (see FIG. 4) embedded together in a pixel array. A screen (i.e., the pixel array) of the display panel 100 is time-division driven in two or more blocks. Each block includes two or more lines on the display panel 100. Each line of the display panel 100 includes horizontally arranged pixels of the same number as a horizontal resolution. Adjacent blocks of the display panel 100 are time-division driven in display periods that are separated from each other with a touch sensing period, in which the touch sensors are driven, interposed therebetween.

The blocks do not need to be physically separated. FIG. 2 illustrates an example where the screen of the display panel 100 is divided into two blocks B1 and B2. FIG. 3 illustrates an example where the screen of the display panel 100 is divided into M blocks B1 to BM, where M is a positive integer equal to or greater than 3. The blocks of the display panel 100 are time-division driven with a touch sensing period interposed therebetween. For example, during a first display period, pixels 11 of a first block B1 are driven, and current frame data is written to the pixels 11. During a first touch sensing period following the first display period, a touch input of the entire screen is sensed. During a second display period following the first touch sensing period, pixels 11 of a second block B2 are driven, and current frame data is written to the pixels 11.

Figure 7:
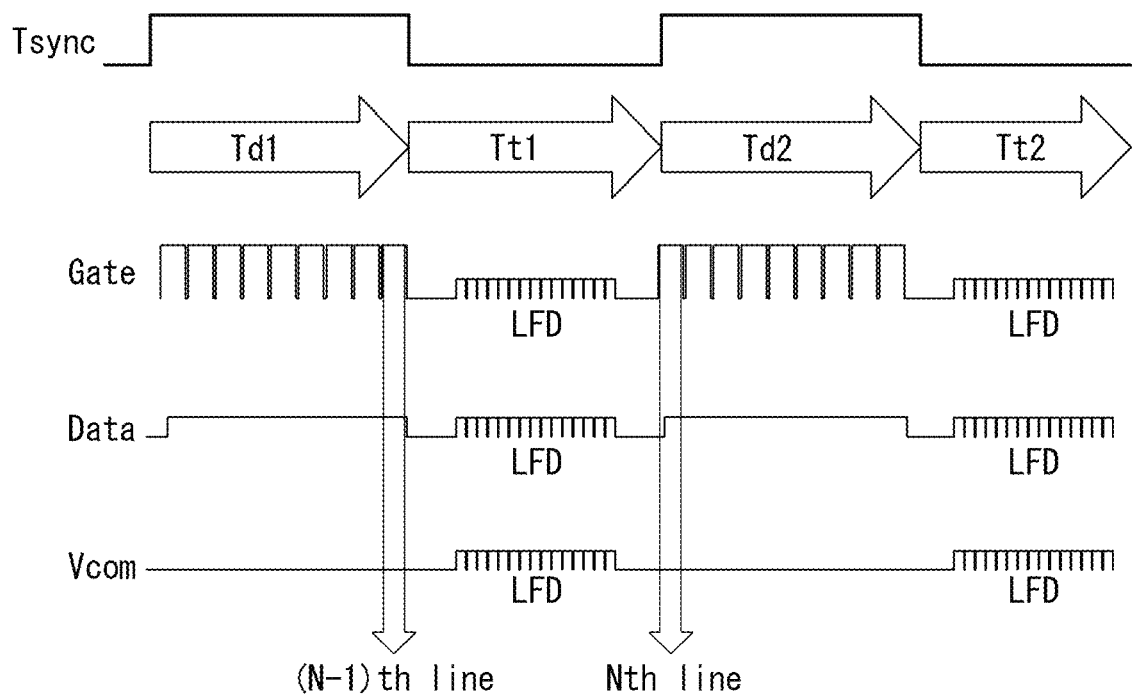
FIG. 7 is a waveform diagram illustrating a driving signal of a display device according to an embodiment.

Embodiments shift the display period and the touch sensing period every predetermined period of time, which may be referred to herein as a "predetermined time." The predetermined time may be one frame period of the display device, but is not limited thereto. A channel position of a gate driver 104 outputting a gate pulses, which is applied to gate lines (N−1)th and Nth lines as shown in FIG. 7, are changed at a boundary between the touch sensing period and the display period in every predetermined time. Thus, the display device according to the embodiment distributes a stress applied to pull-up transistors of the gate driver 104 to a plurality of stages and reduces the stress of the pull-up transistors. As a result, embodiments can increase reliability and lifespan of the gate driver 104 and can prevent a line dim phenomenon in which the boundary between the blocks is visible.

The screen of the display panel 100 includes the pixel array, on which an input image is reproduced. The pixel array includes m×n pixels formed in pixel areas defined by m data lines S1 to Sm and n gate lines G1 to Gn, where m and n are a positive integer. The pixels may include red (R), green (G) and blue (B) subpixels, in order to implement the color. The pixels may further include white subpixels in addition to the R, G and B subpixels. The pixels may further include at least one of cyan (C), magenta (M) and yellow (Y) subpixels.

The pixel array of the display panel 100 may include a thin film transistor (TFT) array and a color filter array. The TFT array may be formed at a lower plate of the display panel 100. The TFT array includes TFTs formed at crossings of the data lines S1 to Sm and the gate lines G1 to Gn, pixel electrodes charged with a data voltage, storage capacitors Cst that are connected to the pixel electrodes and hold the data voltage, and the like. The TFT array displays an input image. The subpixels each may independently include a TFT, a pixel electrode, and a storage capacitor. A structure of the pixels may be changed depending on driving characteristics of the display device.

Figure 4:
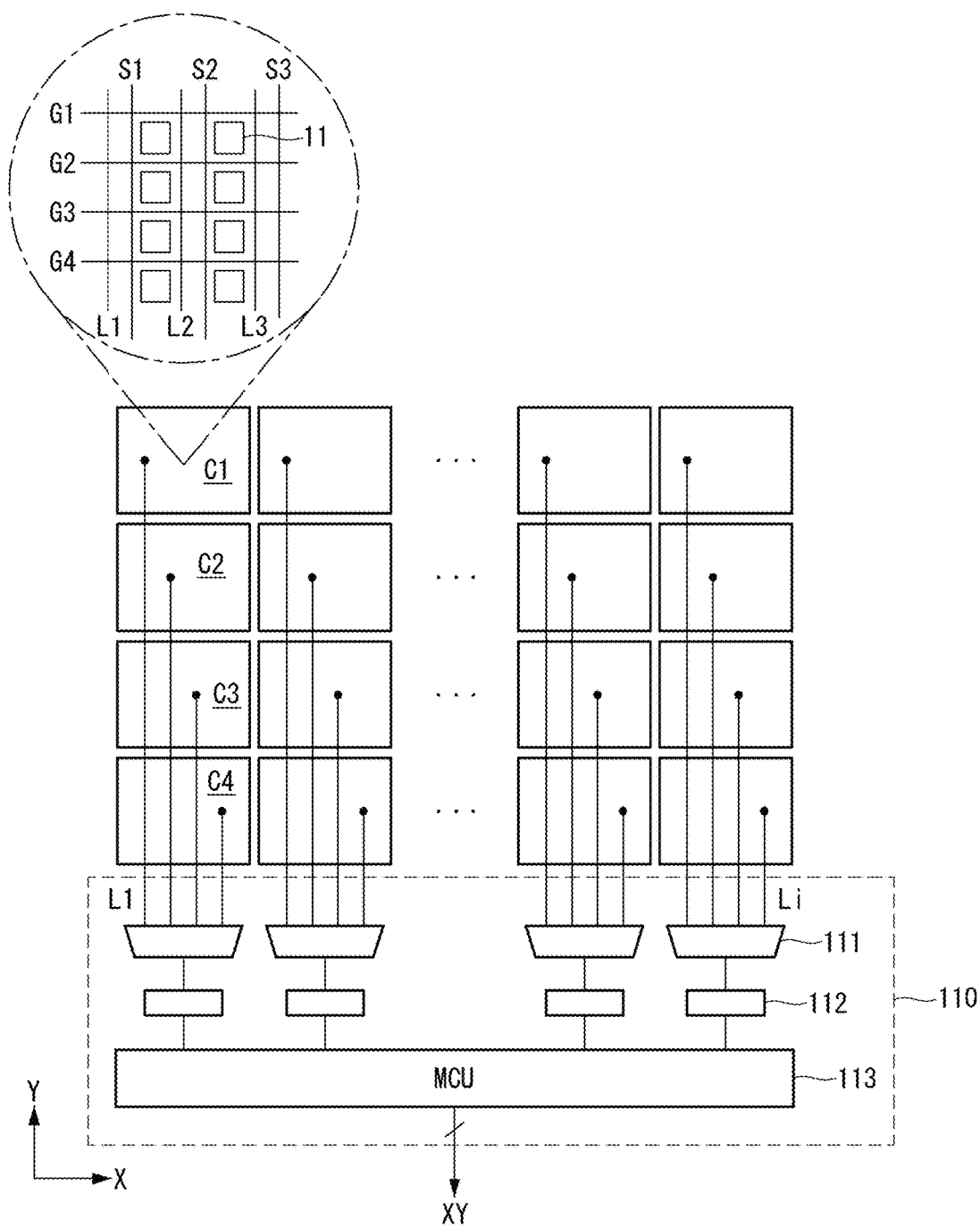
FIG. 4 illustrates a plan layout of in-cell touch sensors and a circuit configuration of a touch sensing unit.

The TFT array of the display panel 100 further includes touch sensor electrodes C1 to Ci (including, e.g., touch sensor electrodes C1 to C4 shown in FIG. 4) and sensor lines L1 to Li connected to the touch sensor electrodes C1 to Ci (e.g., including sensor lines L1 to L4 connected to touch sensor electrodes C1 to C4 shown in FIG. 4), where "i" is a positive integer less than m and n. The touch sensor electrodes C1 to Ci (including, e.g., C1 to C4) may be implemented using a method for dividing a common electrode connected to the plurality of pixels 11. One touch sensor electrode is commonly connected to the plurality of pixels 11 and forms one touch sensor. Thus, the touch sensor supplies a common voltage Vcom of the same level to the pixels 11 through the touch sensor electrode during the display period. In each touch sensing period, the touch sensing unit 110 drives all the touch sensors and senses a touch input of the entire screen of the display panel 100.

The touch sensors embedded in the pixel array may be implemented as capacitive touch sensors. Each capacitive touch sensor may have a capacitance. The capacitance may be divided into a self-capacitance or a mutual capacitance. The self-capacitance may be formed along a conductor line of a single layer formed in one direction, and the mutual capacitance may be formed between two conductor lines perpendicular to each other. FIG. 4 shows a self-capacitance touch sensor by way of example. However, embodiments are not limited thereto.

An upper plate of the display panel 100 may include the color filter array formed at an upper substrate. The color filter array includes black matrixes, color filters, and the like. In case of a COT (color filter on TFT) or TOC (TFT on color filter) model, the TFT array may include the color filters and the black matrixes.

The display driving circuit includes a data driver 102, the gate driver 104, and a timing controller 106. The display driving circuit writes data of an input image to the pixels 11 of the display panel 100 during the display periods which are time-division driven with the touch sensing period interposed therebetween.

During the display period, the data driver 102 converts digital video data of an input image received from the timing controller 106 into a gamma compensation voltage and outputs a data voltage through output channels. The data voltage output from the data driver 102 is supplied to the data lines S1 to Sm during the display period.

During the touch sensing period, the output channels of the data driver 102 may be separated from the data lines S1 to Sm and may maintain a high impedance state. The data voltage stored in capacitors of the pixels 11 is not discharged and is held because the TFTs are not turned on during the touch sensing period.

A multiplexer (not shown) may be disposed between the data driver 102 and the data lines S1 to Sm. The multiplexer may be formed on a substrate of the display panel 100 or may be integrated into a driver integrated circuit (IC) together with the data driver 102. The multiplexer may distribute the data voltage received from the data driver 102 to the data lines S1 to Sm under the control of the timing controller 106. For example, a 1-to-2 multiplexer may time-divide the data voltage input through one output channel of the data driver 102 and supply the time-divided data voltages to two data lines S1 and S2. Thus, the use of the 1-to-2 multiplexer can reduce the number of output channels of the driver IC by half.

The gate driver 104 sequentially supplies a gate pulse (also referred to as a scan pulse) to the gate lines G1 to Gn using a shift register. The shift register shifts the gate pulse in accordance with timing of a shift clock and sequentially supplies the gate pulse to the gate lines G1 to Gn. The gate pulse swings between a gate high voltage VGH and a gate low voltage VGL. The gate high voltage VGH is greater than a threshold voltage of the TFTs included in the pixel array. The gate low voltage VGL is less than the threshold voltage of the TFTs included in the pixel array.

The TFTs of the pixel array are turned on in response to the gate high voltage VGH of the gate pulse and supply the data voltages from the data lines S1 to Sm to the pixel electrodes. The shift register includes cascade-connected stages.

More specifically, the shift register includes stages which are connected in cascade and shift an output in accordance with a shift clock timing. Each stage outputs the gate pulse to the gate lines G1 to Gn of the display panel 100 in response to a voltage of a Q node and transmits a carry signal to a next stage. The carry signal may be output as a gate pulse or a separate signal. The Q node is charged in response to a start signal or a carry signal from a previous stage and pre-charges a gate of a pull-up transistor. When the Q node receives the shift clock in a state of being pre-charged, the Q node is bootstrapped through a parasitic capacitance between the gate and a drain of the pull-up transistor. When a voltage of the Q node rises due to the bootstrapping, the pull-up transistor is turned on. Hence, a voltage of an output terminal rises to the gate high voltage VGH, and the gate pulse starts to be output. The gate pulse is applied to the gate lines G1 to Gn and simultaneously turns on the TFTs of the line supplied with the data voltage.

The shift clock is not input to the shift register within the touch sensing period so that the gate pulse is not output from the shift register of the gate driver 104. As a result, the gate driver 104 does not output the gate pulse during the touch sensing period.

The shift register of the gate driver 104 may be mounted on the substrate of the display panel 100 together with the TFT array. Hereinafter, the shift register mounted on the substrate of the display panel 100 is referred to as a "gate-in panel (GIP) circuit".

The timing controller 106 transmits the digital video data of the input image received from a host system (not shown) to the data driver 102. The timing controller 106 receives timing signals, such as a vertical sync signal Vsync, a horizontal sync signal Hsync, a data enable signal DE, and a main clock MCLK, in synchronization with data of the input image. The timing controller 106 generates a data timing control signal for controlling operation timing of the data driver 102 and a gate timing control signal for controlling operation timing of the gate driver 104 based on the timing signals.

The gate timing control signal includes a start signal VST, a shift clock CLK, an output enable signal GOE, and the like. The output enable signal GOE may be omitted in the GIP circuit. The start signal VST is input to a start signal input terminal of a first stage of the shift register of the gate driver 104 and controls an output timing of a first gate pulse that is first generated in one frame period. The shift clocks CLK are sequentially generated during the display period to control an output timing of the gate pulse in each stage and to control a shift timing of the gate pulse in each stage. The shift clock CLK is not generated in the touch sensing period. When the shift clock CLK is generated in the touch sensing period, the data voltages applied to the pixels 11 may be discharged or an undesired noise may appear on the screen. The output enable signal GOE controls an output timing of the gate driver 104.

When the gate driver 104 is implemented as the GIP circuit, the gate timing control signal generated by the timing controller 106 is converted into a voltage swinging between the gate high voltage VGH and the gate low voltage VGL by a level shifter (not shown) and is input to the GIP circuit. Thus, the start signal MST and the shift clock CLK input to the GIP circuit swing between the gate high voltage VGH and the gate low voltage VGL.

The host system may be one of a television system, a set-top box, a navigation system, a DVD player, a Blu-ray player, a personal computer (PC), a home theater system, a phone system, and other systems that include or operate in conjunction with a display. The host system includes a system-on chip (SoC), in which a scaler is embedded, and converts digital video data of an input image into a format suitable for displaying the input image on the display panel 100. The host system transmits the digital video data of the input image and the timing signals Vsync, Hsync, DE, and MCLK to the timing controller 106. The host system executes an application associated with coordinate information (e.g., an X-Y coordinate point) of a touch input received from the touch sensing unit 110.

The timing controller 106 or the host system defines the display period and the touch sensing period and generates a sync signal Tsync for synchronizing the display driving circuit (102, 104, and 106) with the touch sensing unit 110. Embodiments change the sync signal Tsync every predetermined time and vary the touch sensing period and the display period following the touch sensing period. Hence, embodiments distribute a stress of a stage, of which a Q node is charged, to other stages and increase the reliability of the shift register. Embodiments increase the reliability of the shift register and reduce a difference in a delay time of the gate pulse between the display period and the touch sensing period. As a result, embodiments can increase the reliability and the lifespan of the gate driver 104 and can improve the image quality of the display device so that the line dim is not visible at a boundary between the blocks of the screen.

The touch sensing unit 110 drives the touch sensors in response to the sync signal Tsync received from the timing controller 106 or the host system during the touch sensing period. The touch sensing unit 110 supplies a touch driving signal to the sensor lines L1 to Li and senses a touch input during the touch sensing period. The touch sensing unit 110 compares a change in a capacitance of the touch sensor, which varies depending on the presence or absence of a touch input, with a predetermined threshold value. When the change in the capacitance of the touch sensor is equal to or greater than the predetermined threshold value, the touch sensing unit 110 determines the touch sensor as a touch input and calculates coordinates of a position of the touch input. The touch sensing unit 110 transmits coordinate information of the touch input position to the host system.

FIG. 4 illustrates a plan layout of in-cell touch sensors and a circuit configuration of the touch sensing unit.

Referring to FIG. 4, each of the touch sensor electrodes C1 to Ci may be formed as a division pattern of a common electrode of the plurality of pixels 11.

The touch sensing unit 110 includes a plurality of multiplexers 111, a plurality of sensing circuits 112, and a microcontroller unit (MCU) 113.

Each multiplexer 111 selects k consecutive sensor lines to be connected to a corresponding sensing circuit 112 under the control of the MCU 113, where k is a positive integer equal to or greater than 2. Each multiplexer 111 may supply the common voltage Vcom to the k sensor lines under the control of the MCU 113. Each multiplexer 111 sequentially connects the k sensor lines to a channel of the sensing circuit 112, thereby reducing the number of channels of the sensing circuit 112. For example, first four sensor lines L1 to L4 may be connected to a first multiplexer 111, which may be connected to a first sensing circuit 112, next four sensor lines L5 to L8 may be connected to a next multiplexer 111, which may be connected to a next sensing circuit 112, etc., and last four sensor lines L(i−3) to Li may be connected to a last multiplexer 111, which may be connected to a last sensing circuit 112, as shown in FIG. 4. That is, in this example, k=4, the number i of touch sensor electrodes Ci and sensor lines Li may be a multiple of 4, and the number of multiplexers 111 and sensing circuits 112 may be i/k=i/4.

The sensing circuit 112 amplifies and integrates an amount of charges of a touch sensor signal received via the multiplexer 111 and converts it into digital data, thereby detecting a change in a capacitance of the touch sensor. The sensing circuit 112 includes an amplifier amplifying the received touch sensor signal, an integrator accumulating an output voltage of the amplifier, and an analog-to-digital converter (ADC) converting a voltage of the integrator into digital data. The sensing circuit 112 transmits digital data, as touch raw data, output from the ADC to the MCU 113.

The MCU 113 controls the multiplexers 111 and connects the sensor lines L1 to Li to the sensing circuits 112. The MCU 113 compares the touch raw data received from the sensing circuit 112 with a predetermined threshold value and determines a touch input. The MCU 113 performs a previously set touch sensing algorithm and calculates coordinates of a position of each touch input. The MCU 113 produces touch coordinate data (e.g., in the X and Y axis) and transmits the touch coordinate data XY to the host system.

Figure 5:
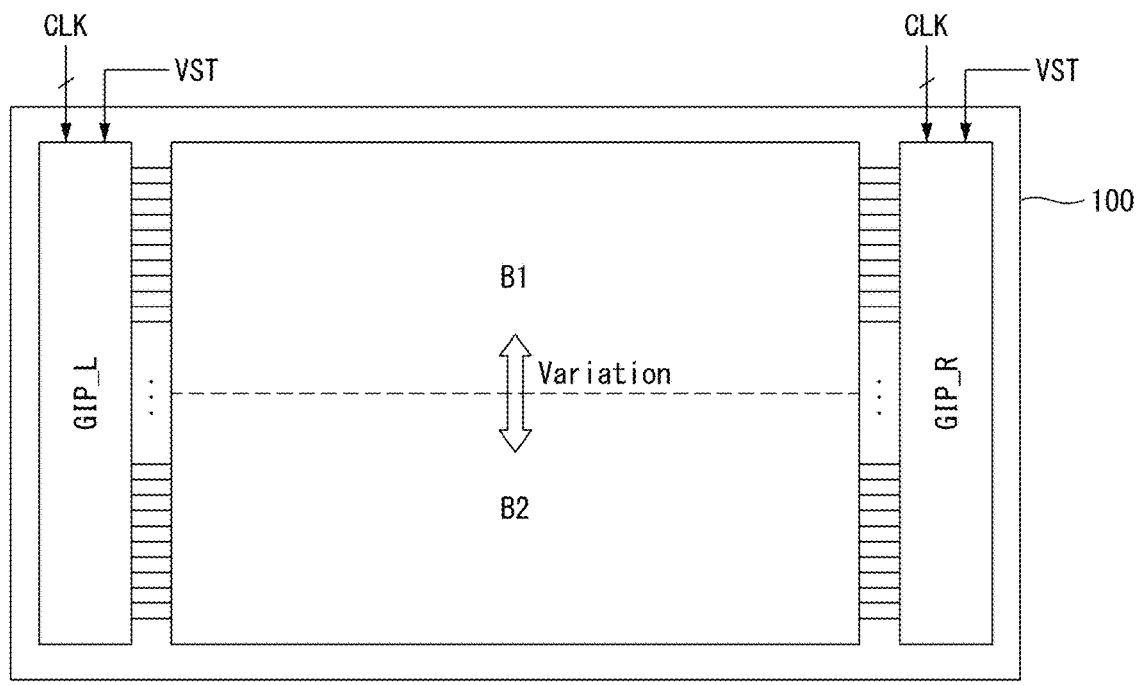
FIG. 5 illustrates an example where gate-in panel (GIP) circuits are respectively disposed on both sides of a display panel.
Figure 6:
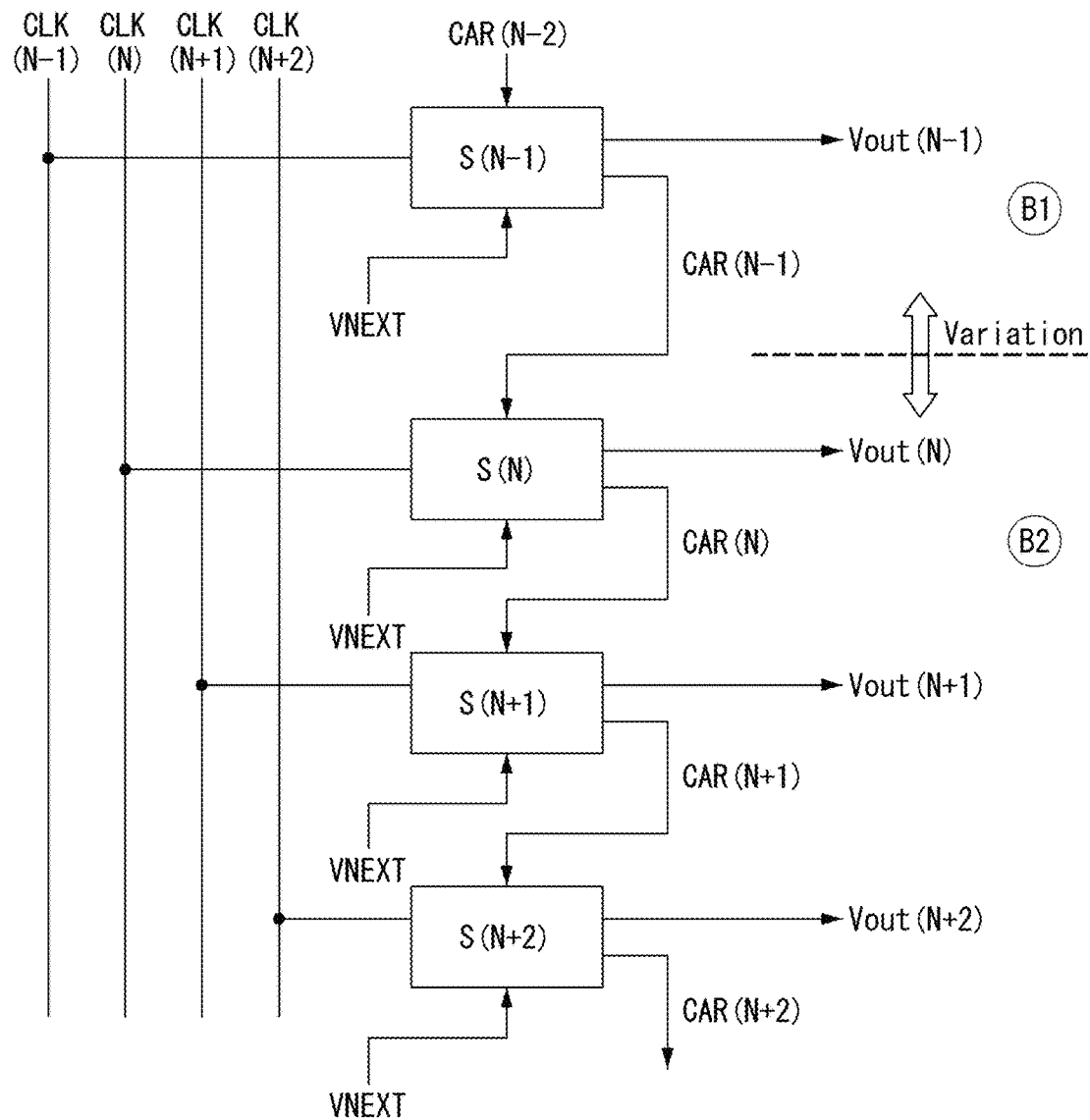
FIG. 6 schematically illustrates a part of a GIP circuit disposed at a boundary between adjacent blocks.

FIG. 5 illustrates an example where GIP circuits are respectively disposed on both sides of the display panel. FIG. 6 schematically illustrates a part of a GIP circuit disposed at a boundary between adjacent blocks.

Referring to FIGS. 5 and 6, the gate driver 104 may be implemented as a GIP circuit on a lower substrate of the display panel 100 on which the pixel array is formed. Alternatively, the gate driver 104 may be implemented as a separate IC and attached to the lower substrate of the display panel 100.

The GIP circuit may be disposed at one edge of the display panel 100, or may be disposed at both edges of the display panel 100 as shown in FIG. 5. As shown in FIG. 5, GIP circuits GIP_L and GIP_R each include a shift register sequentially shifting gate pulses under the control of the timing controller 106.

Transistors of the GIP circuits GIP_L and GIP_R may include at least one of a TFT including amorphous silicon (a-Si), an oxide transistor including oxide semiconductor, or a low-temperature polycrystalline silicon (LTPS) transistor including LTPS.

The first GIP circuit GIP_L is disposed outside the left side of the pixel array. The first GIP circuit GIP_L may be connected to odd-numbered gate lines G1, G3, . . . , Gn−1 of the pixel array and may sequentially output the gate pulses to the odd-numbered gate lines G1, G3, . . . , Gn−1. The second GIP circuit GIP_R is disposed outside the right side of the pixel array. The shift register of the second GIP circuit GIP_R may be connected to even-numbered gate lines G2, G4, . . . , Gn of the pixel array and may sequentially output the gate pulses to the even-numbered gate lines G2, G4, . . . , Gn. Alternatively, the second GIP circuit GIP_R may be connected to the odd-numbered gate lines and the first GIP circuit GIP_L may be connected to the even-numbered gate lines.

As described above, each of the GIP circuits GIP_L and GIP_R includes a shift register that receives the start signal VST and the shift clock CLK and sequentially outputs the gate pulses.

Each of stages of the shift register includes a pull-up transistor, a pull-down transistor, a Q node controlling the pull-up transistor, a QB node controlling the pull-down transistor, and a controller controlling the charge and the discharge of the Q node and the QB node. Each stage pre-charges the Q node in response to a start signal, or a carry signal received from a previous stage, input to a start signal input terminal and increases a voltage of an output terminal to the gate high voltage VGH when a shift clock is input, thereby starting to output the gate pulse.

The controller controls a charge timing and a discharge timing of the QB node. The controller increases the gate high voltage VGH in a low temperature environment in response to an output signal of a temperature sensor and can compensate for a reduction in an ON-current of the transistors at a low temperature. Since the controller may be implemented as any known circuit, a description of detailed circuit configuration and operation of the controller is omitted.

Referring to FIG. 6, stages S(N−1) to S(N+2) are connected in cascade and sequentially shift the gate pulses in accordance with timing of shift clocks CLK(N−1) to CLK(N+2). Each of the stages S(N−1) to S(N+2) includes a VST terminal supplied with the start signal VST or carry signals CAR(N−2) to (N+1) from a previous stage, an output terminal to which gate pulses Vout(N−1) to Vout(N+2) and the carry signals CAR(N−1) to (N+2) are output, a VNEXT terminal supplied with a VNEXT signal (wherein the VNEXT signals correspond to the carry signals CAR(N) to (N+3) of a next stage), a CLK terminal supplied with the shift clocks CLK(N−1) to CLK(N+2), and the like. FIG. 6 illustrates that the gate pulse Vout and the carry signal CAR corresponding to each stage are separated from each other, by way of example. However, because the gate pulses Vout(N−1), Vout(N), Vout(N+1) and Vout(N+2) output from the stages may be transmitted as the carry signal of the next stage, an output method of the stages is not limited to FIG. 6.

The display device according to the embodiment shifts the touch sensing period and the display period every predetermined time. In the GIP circuit, a stress (i.e., a DC gate bias stress of the pull-up transistors) of the stages, of which the Q nodes are in a charged state during the touch sensing period, is relatively greater than a stress of other stages. The display device according to the embodiment distributes the stress of the pull-up transistors to the plurality of stages by shifting the touch sensing period and the display period every predetermined time. For example, the display device according to the embodiment may allocate a touch sensing period of a first frame period between an output timing of the (N−1)th stage S(N−1) and an output timing of the Nth stage S(N) using the sync signal Tsync, and then allocate a touch sensing period of a second frame period between an output timing of the (N+1)th stage S(N+1) and an output timing of the (N+2)th stage S(N+2) using the sync signal Tsync.

FIG. 7 is a waveform diagram illustrating a driving signal of the display device according to the embodiment. In FIG. 7, "Gate" is a voltage applied to the gate lines G1 to Gn, "Data" is a voltage applied to the data lines S1 to Sm, and Vcom is a voltage applied to the touch sensor electrode.

Referring to FIG. 7, one frame period may be time-divided into display periods Td1 and Td2 and touch sensing periods Tt1 and Tt2. One frame period may be time from one vertical synchronization pulse to a next vertical synchronization pulse (not shown). One touch sensing period is allocated between the display periods Td1 and Td2. During a first display period Td1, the display driving circuit (102, 104, and 106) writes current frame data to pixels of a first block B1 (e.g., block B1 shown in FIG. 5) and updates an image reproduced on the first block B1 to the current frame data.

During the first display period Td1, a remaining block B2 (e.g., block B2 shown in FIG. 5) other than the first block B1 holds previous frame data, and the touch sensing unit 110 does not drive the touch sensors. Subsequently, during a first touch sensing period Tt1, the touch sensing unit 110 sequentially drives all of the touch sensors with a touch sensor driving signal, senses a touch input, generates a touch report including coordinate information and identification information of each touch input, and transmits the touch report to the host system.

Subsequently, during a second display period Td2, the display driving circuit (102, 104, and 106) writes current frame data to pixels of a second block B2 and updates an image reproduced on the second block B2 to the current frame data. During the second display period Td2, the first block B1 holds current frame data, and the touch sensing unit 110 does not drive the touch sensors with a touch sensor driving signal. Subsequently, during a second touch sensing period Tt2, the touch sensing unit 110 sequentially drives all the touch sensors with the touch sensor driving signal, senses a touch input, generates a touch report including coordinate information and identification information of each touch input, and transmits the touch report to the host system.

During the touch sensing periods Tt1 and Tt2, the touch sensing unit 110 supplies the sensor driving signal to the touch sensor through the sensor lines L1 to Li, detects a change in a capacitance of the touch sensor before and after the touch input, compares the change in the capacitance of the touch sensor with a threshold voltage, and determines the touch input.

The touch sensing unit 110 transmits coordinate information of a touch input to the host system in each touch sensing period. Thus, a touch report rate is greater than a frame rate. The frame rate is a frame frequency at which an image of one frame is written to the pixel array. The touch report rate is a rate at which the coordinate information of the touch input is generated. As the touch report rate increases, a coordinate recognition rate of the touch input increases. As a result, touch sensitivity is improved.

The in-cell touch sensor technology divides a common electrode of the pixels of the display panel 100 based on the touch sensors and uses the divided common electrodes as electrodes of the touch sensors. For example, when the liquid crystal display is used as described above, the in-cell touch sensor technology divides a common electrode and uses divided common electrode patterns as electrodes of self-capacitance touch sensors shown in FIGS. 2 and 3. Because the touch sensors are coupled with the pixels, a parasitic capacitance between the pixels and the touch sensors increases. Because the pixels and the touch sensors are coupled with each other through the parasitic capacitance, the pixels and the touch sensors may electrically adversely affect each other. Therefore, the pixels and the touch sensors are time-division driven. Even if the time-division driving method is used, the touch sensitivity and the touch recognition accuracy of the touch sensors may be reduced due to the parasitic capacitance of the display panel 100.

During the touch sensing periods Tt1 and Tt2, the data driver 102 may supply an AC signal (referred to herein as a load free drive (LFD) signal) having the same phase and the same voltage as a sensor driving signal to the data lines S1 to Sm, so as to reduce a parasitic capacitance between the pixels 11 and the touch sensors. When there is no voltage difference between both ends of a parasitic capacitance between the data lines S1 to Sm and the touch sensors, a magnitude of the parasitic capacitance is reduced. Thus, when the sensor driving signal is supplied to the touch sensor, the magnitude of the parasitic capacitance between the data lines S1 to Sm and the touch sensors can be reduced when the LFD signal having the same phase and the same voltage as the sensor driving signal is supplied to the data lines S1 to Sm.

In the same manner as the data driver 102, during the touch sensing periods Tt1 and Tt2, the gate driver 104 may supply a LFD signal having the same phase and the same voltage as a sensor driving signal to the gate lines G1 to Gn, so as to reduce a parasitic capacitance between the pixels 11 and the touch sensors. When there is no voltage difference between both ends of a parasitic capacitance between the gate lines G1 to Gn and the touch sensors, a magnitude of the parasitic capacitance is reduced. Thus, when the sensor driving signal is supplied to the touch sensor, the magnitude of the parasitic capacitance between the gate lines G1 to Gn and the touch sensors can be reduced when the LFD signal having the same phase and the same voltage as the sensor driving signal is supplied to the gate lines G1 to Gn.

The touch sensing unit 110 can reduce a parasitic capacitance between the sensor lines by supplying the LFD signal to the sensor lines other than the sensor lines connected to the touch sensors sensing a current touch input.

When the LFD signal having the same phase as the sensor driving signal is supplied to the data lines S1 to Sm and the gate lines G1 to Gn of the display panel 100 and the touch sensors, which are not currently connected, during the touch sensing periods Tt1 and Tt2, an amount of charges of a parasitic capacitance of the display panel 100 may decrease. This is because the amount of charges of the parasitic capacitance may be reduced by reducing a voltage difference between both ends of the parasitic capacitance. Due to a decrease in the parasitic capacitance of the touch sensor, the touch sensing unit 110 can improve a signal-to-noise ratio (abbreviated to SNR or S/N) of the sensor driving signal, increase an operating margin of the touch sensing unit 110, and improve the touch input and the touch sensitivity.

In FIG. 7, "(N−1)th line" is an (N−1)th gate line supplied with a last gate pulse of an (N−1)th block of pixels, and "Nth line" is a Nth gate line supplied with a first gate pulse of a Nth block of pixels starting again to drive the pixel subsequent to the touch sensing periods Tt1 and Tt2. Embodiments shift the touch sensing period every predetermined time and change positions of the (N−1)th line and the Nth line every predetermined time, so as to distribute the stress of the stages.

The transistors of the GIP circuits GIP_L and GIP_R may be manufactured as TFTs including amorphous silicon (a-Si). Because a leakage current (i.e., an off-current) of the a-Si TFT flowing in an off-state is high, the a-Si TFT increases a discharge amount of the Q node during the touch sensing period. Due to the discharge, luminance is reduced at a boundary between adjacent blocks (e.g., blocks B1 and B2 in FIG. 5, or any two adjacent blocks among the blocks B1 to BM in FIG. 3), a phenomena referred to herein as "line dim."

The gate driver 104 according to the embodiment may include a discharge blocking circuit that suppresses a delay of a voltage of a Q node of a stage outputting a first gate pulse in a block to be driven after a touch sensing period. Because the voltage of the Q node is not discharged by the discharge blocking circuit during the touch sensing period, the first gate pulse generated after the touch sensing period is generated at a voltage required for a normal operation of the pixels 11. The embodiments add the discharge blocking circuit to the stages of the shift register, thereby preventing problems generated when one frame period is time-divided into the display period and the touch sensing period. For example, the embodiments can prevent the line from being displayed on the screen after the touch sensing period and prevent the data voltage from being abnormally charged to the pixels 11 after the touch sensing period. Further, the display device according to the embodiment shifts the display period and the touch sensing period every predetermined time and distributes a stress of the pull-up transistors of the shift register, thereby reducing a variation in a delay time between the gate pulses output from the shift register. Thus, the display device according to the embodiment reduces a variation of the gate pulses in the display period and the touch sensing period to uniformize charge characteristics of the pixels on the entire screen, and as a result, can improve the image quality.

Figure 8:
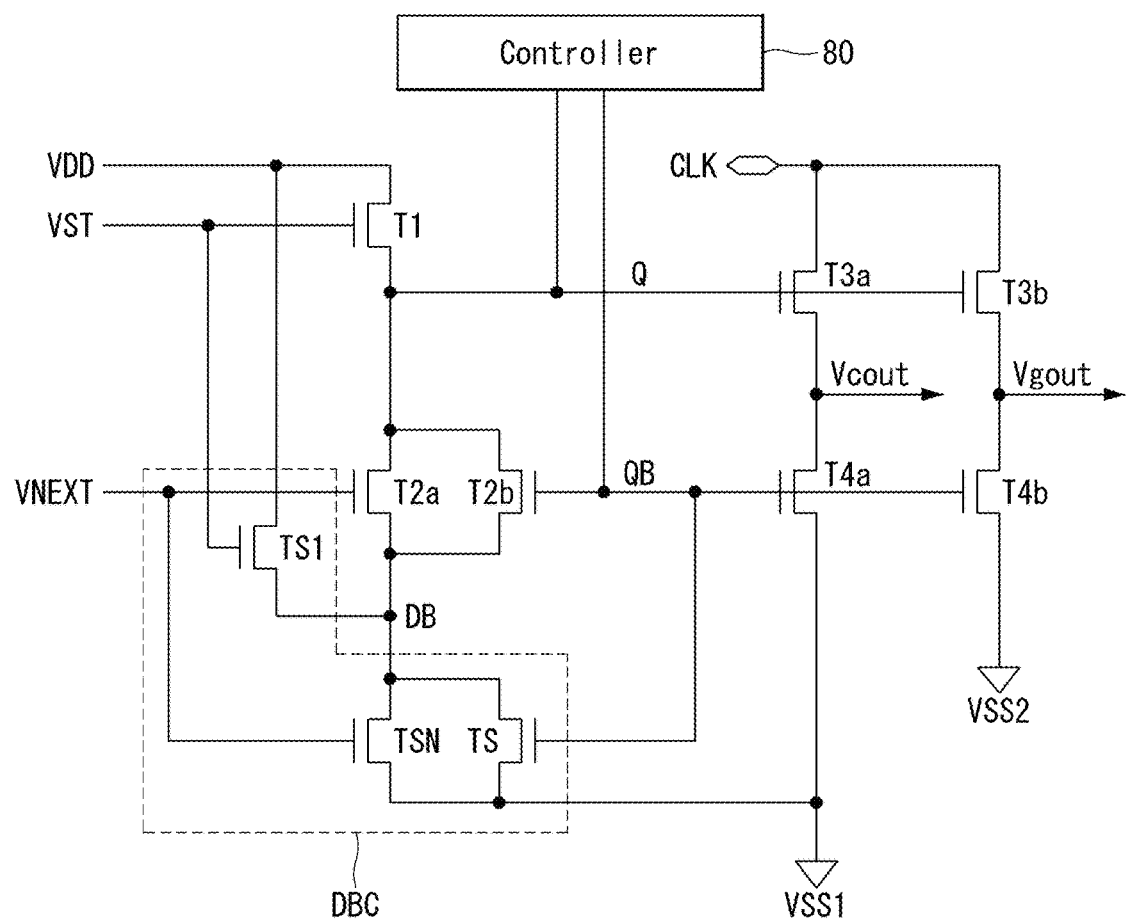
FIG. 8 is a circuit diagram of a gate driver circuit according to an embodiment.
Figure 9:
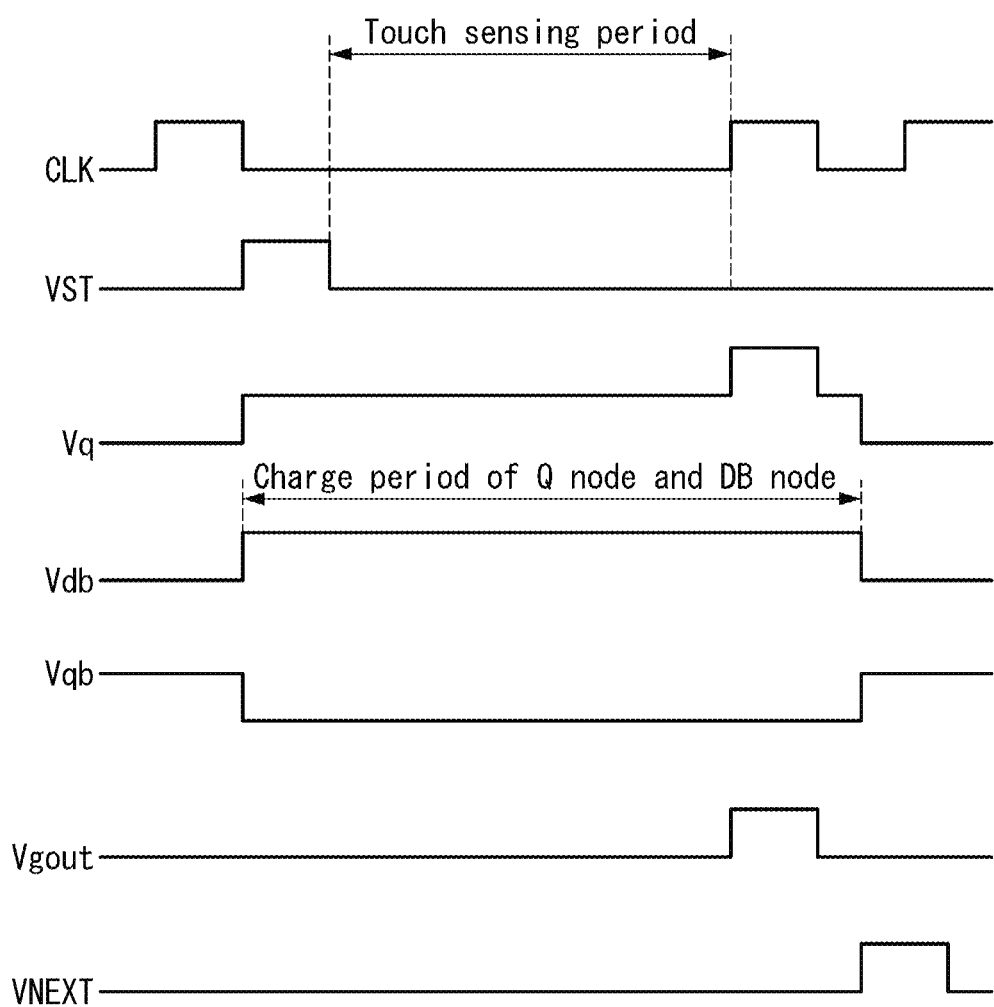
FIG. 9 is a waveform diagram illustrating an operation of a gate driver circuit shown in FIG. 8.

FIG. 8 is a circuit diagram of an Nth stage of the shift register according to the embodiment. Since a circuit configuration of each of the stages constituting the shift register according to embodiments is substantially the same as a circuit configuration illustrated in FIG. 8, a description thereof is omitted. FIG. 9 is a waveform diagram illustrating an operation of a gate driver circuit shown in FIG. 8. The shift register may use any known circuit as long as it is a shift register of the gate driver circuit applicable to the in-cell touch sensor technology. A stage circuit of the shift register is not limited to FIG. 8. However, embodiments may use a stage circuit having a function of suppressing the discharge of the Q node during the touch sensing period as shown in FIG. 8.

Referring to FIGS. 8 and 9, the gate driver circuit according to the embodiment includes a shift register that sequentially outputs gate pulses through cascade-connected stages. An Nth stage S(N) of the shift register outputs a gate pulse Vgout through a first output terminal, and at the same time, outputs a carry signal Vcout through a second output terminal. The first output terminal is connected to a gate line of the display panel 100. The second output terminal is not connected to the gate line and is connected to a VST terminal of a next stage.

The Nth stage S(N) includes a Q node, a QB node, a switching circuit connected to the Q node and the QB node, and the like. The Q node is a first control node connected to gates of pull-up transistors T3a and T3b. The QB node is a second control node connected to gates of pull-down transistors T4a and T4b.

The switching circuit includes transistors T1 to T4d and a discharge blocking circuit DBC.

The first transistor T1 supplies a high potential power voltage VDD to the Q node in response to a start signal, or a carry signal from a previous stage, input through a VST terminal and pre-charges the Q node. The high potential power voltage VDD may be set to a gate high voltage VGH. The first transistor T1 includes a gate connected to the VST terminal, a drain supplied with the high potential power voltage VDD through a VDD terminal, and a source connected to the Q node.

The second transistor and the discharge blocking circuit DBC switch on and off a discharge path between the Q node and a VSS1 terminal. The second transistor may include transistors T2a and T2b, but is not limited thereto. The transistor T2a discharges the Q node in response to a carry signal VNEXT received from a next stage through a VNEXT terminal. The transistor T2a includes a gate connected to the VNEXT terminal, a drain connected to the Q node, and a source connected to a discharge blocking node (hereinafter referred to as "DB node"). The next stage in case of the Nth stage S(N) may be a (N+1)th stage or one of (N+1)th to (N+4)th stages.

The transistor T2b connects the Q node to the DB node in response to a voltage of the QB node. The transistor T2b includes a gate connected to the QB node, a drain connected to the Q node, and a source connected to the DB node. The DB node exists on a discharge path between the discharge blocking circuit DBC and the transistors T2a and T2b. The DB node is charged by the discharge blocking circuit DBC at the same time as when the Q node is charged, and is discharged by the discharge blocking circuit DBC at the same time as when the Q node is discharged. The DB node suppresses a discharge of the Q node by reducing drain-to-source voltages of the transistors T2a and T2b that switch on and off the discharge path of the Q node during the touch sensing period.

The transistor T3a is a first pull-up transistor that is turned on in accordance with a voltage Vq of the Q node which rises when the shift clock CLK is input, supplies a voltage of the shift clock CLK to the second output terminal, and increases a voltage of the carry signal Vcout. A voltage of the shift clock CLK (e.g., a high level of the shift clock CLK) may be substantially equal to the gate high voltage VGH. The transistor T3a includes a gate connected to the Q node, a drain to which the shift clock CLK is input through a CLK terminal, and a source connected to the second output terminal.

The transistor T3b is a second pull-up transistor that is turned on in accordance with the voltage Vq of the Q node which rises when the shift clock CLK is input, supplies the voltage of the shift clock CLK to the first output terminal, and increases a voltage of the gate pulse Vgout. The transistor T3b includes a gate connected to the Q node, a drain to which the shift clock CLK is input through the CLK terminal, and a source connected to the first output terminal. The first output terminal is connected to the gate line of the display panel 100.

The Q node is pre-charged with the gate high voltage VGH by the high potential power voltage VDD supplied through the first transistor T1. Subsequently, the voltage Vq of the Q node increases by 2VGH due to bootstrapping when the shift clock CLK is input, and turns on the pull-up transistors T3a and T3b. The Q node is discharged during a charge period of the QB node by a controller 80 and maintains an off-state. Further, during the touch sensing period, the Q node is not discharged due to a charged voltage Vdb of the DB node and maintains a charging state.

The transistor T4a is a first pull-down transistor that discharges a voltage of the second output terminal to a first low potential power voltage VSS1 in response to a voltage Vqb of the QB node. The transistor T4a includes a gate connected to the QB node, a drain connected to the first output terminal, and a source connected to a VSS1 terminal supplied with the first low potential power voltage VSS1.

The transistor T4b is a second pull-down transistor that discharges a voltage of the first output terminal to a second low potential power voltage VSS2 in response to the voltage Vqb of the QB node. The transistor T4b includes a gate connected to the QB node, a drain connected to the first output terminal, and a source connected to a VSS2 terminal supplied with the second low potential power voltage VSS2.

The second low potential power voltage VSS2 may be substantially equal to the gate low voltage VGL. The first low potential power voltage VSS1 may be less than the second low potential power voltage VSS2. However, embodiments are not limited thereto.

The QB node is discharged by the controller 80 during a charge period of the Q node. The QB node is discharged during a scan period and controls the pull-down transistors T4a and T4b in an OFF-state (in other words, the QB node may maintain the pull-down transistors T4a and T4b in the OFF-state while the QB node is in the discharged state). The QB node is charged during a remaining period excluding the scan period from one frame period and discharges the voltages of the output terminals to the second low potential power voltage VSS2.

The controller 80 may discharge the QB node in accordance with a charge voltage of the Q node and discharge the Q node in accordance with a charge voltage of the QB node using an inverter circuit.

The discharge blocking circuit DBC charges the DB node during a charge period of the Q node to block the discharge path of the Q node and discharges the DB node during a discharge period of the Q node to form the discharge path of the Q node. The charge period of the Q node includes a pre-charge period of the Q node and a bootstrapping period according to the input of the shift clock. The discharge period of the Q node is a period in which the Q node is discharged and the voltage Vq of the Q node is held at the first low potential power voltage VSS1. Further, a charge period of the QB node is a period in which the QB node is charged and the voltage Vqb of the QB node is held at the gate high voltage VGH. The discharge period of the QB node is a period in which the QB node is discharged and the voltage Vqb of the QB node is held at the first low potential power voltage VSS1.

When the DB node is charged with the high potential power voltage VDD, source voltages of the transistors T2a and T2b are the gate high voltage VGH. When the Q node is pre-charged with the gate high voltage VGH and at the same time the DB node is charged with the gate high voltage VGH, a leakage current does not flow in the transistors T2a and T2b by reducing a drain-to-source voltage Vds of the transistors T2a and T2b in an off-state of the transistors T2a and T2b. Therefore, a discharge path of the Q node is blocked. On the other hand, when a gate-to-source voltage of the transistors T2a and T2b is greater than a threshold voltage, the transistors T2a and T2b are turned on. Therefore, a discharge path is formed between the Q node and the VSS1 terminal, and the Q node is discharged.

The discharge blocking circuit DBC includes a first discharge control switch TS1, a second discharge control switch TSN, and a third discharge control switch TS. The discharge control switches TS1, TSN, and TS are implemented as TFTs.

The first discharge control switch TS1 is turned on at the same time as when the first transistor T1 is turned on, and charges the DB node. Due to the first discharge control switch TS1, the DB node is charged at the same time as when the Q node is charged. The first discharge control switch TS1 supplies the high potential power voltage VDD to the DB node in response to a start signal VST (as shown), or a carry signal from a previous stage, input through the start signal input terminal, thereby charging the DB node to the gate high voltage VGH. The first discharge control switch TS1 includes a gate connected to the start signal input terminal, a drain connected to the VDD terminal, and a source connected to the DB node.

The second discharge control switch TSN is turned on at the same time as when the transistor T2a is turned on, and discharges the DB node. Due to the second discharge control switch TSN, the DB node is discharged at the same time as when the Q node is discharged. The second discharge control switch TSN discharges the DB node in response to the carry signal VNEXT of the next stage input through the VNEXT terminal. The second discharge control switch TSN includes a gate connected to the VNEXT terminal, a drain connected to the DB node, and a source connected to the VSS1 terminal.

The third discharge control switch TS is turned on at the same time as when the transistor T2b is turned on, and discharges the DB node. Due to the third discharge control switch TS, the DB node is discharged during a charge period of the QB node. The third discharge control switch TS includes a gate connected to the QB node, a drain connected to the DB node, and a source connected to the VSS1 terminal.

Figure 10A:
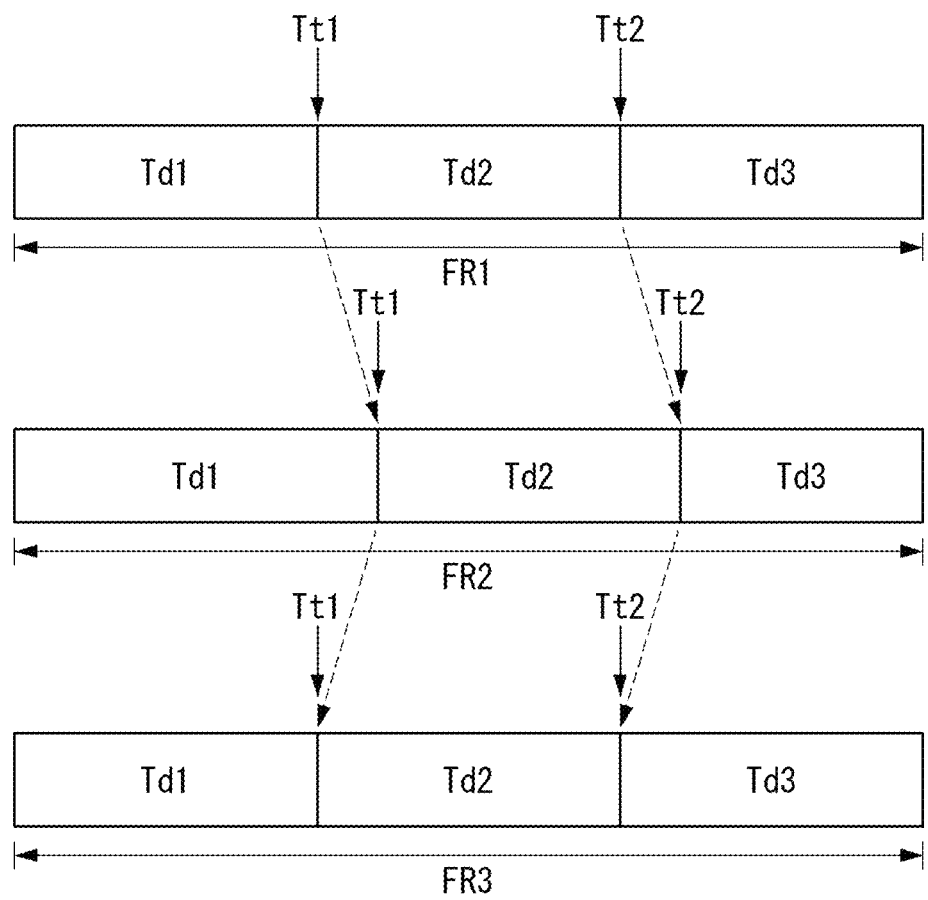
FIGS. 10A and 10B illustrate an example where a touch sensing period and a display period are shifted every predetermined time.
Figure 10B:
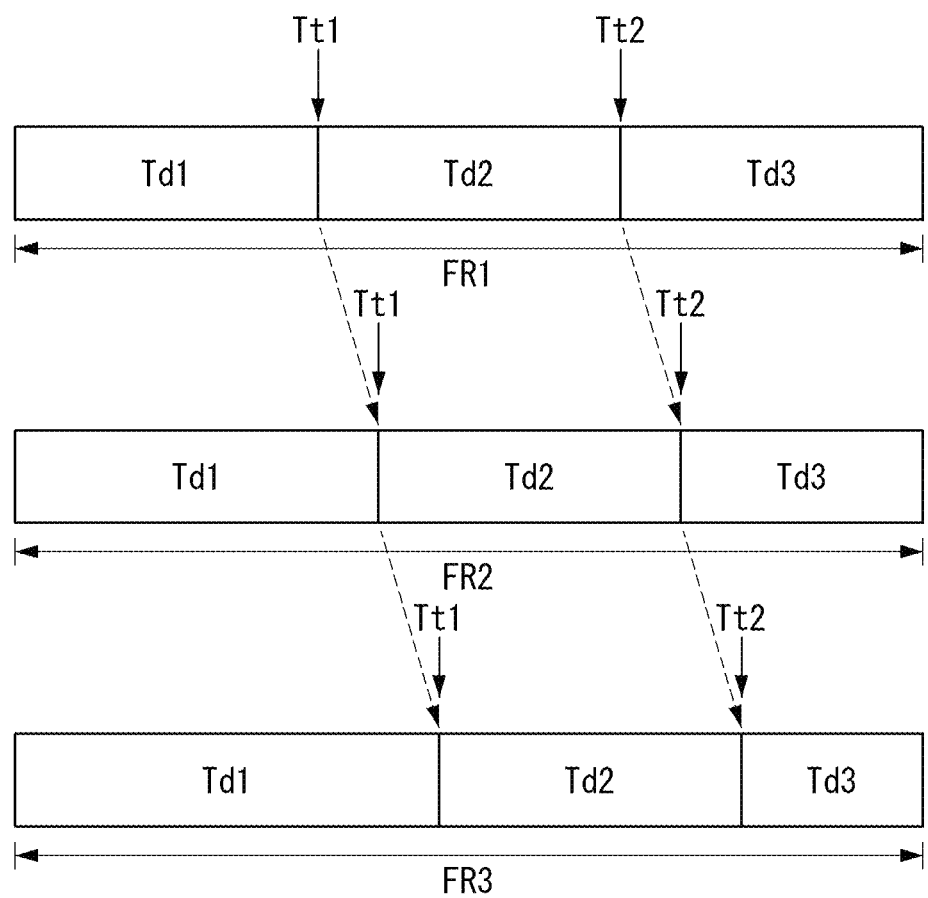
Figure 11:
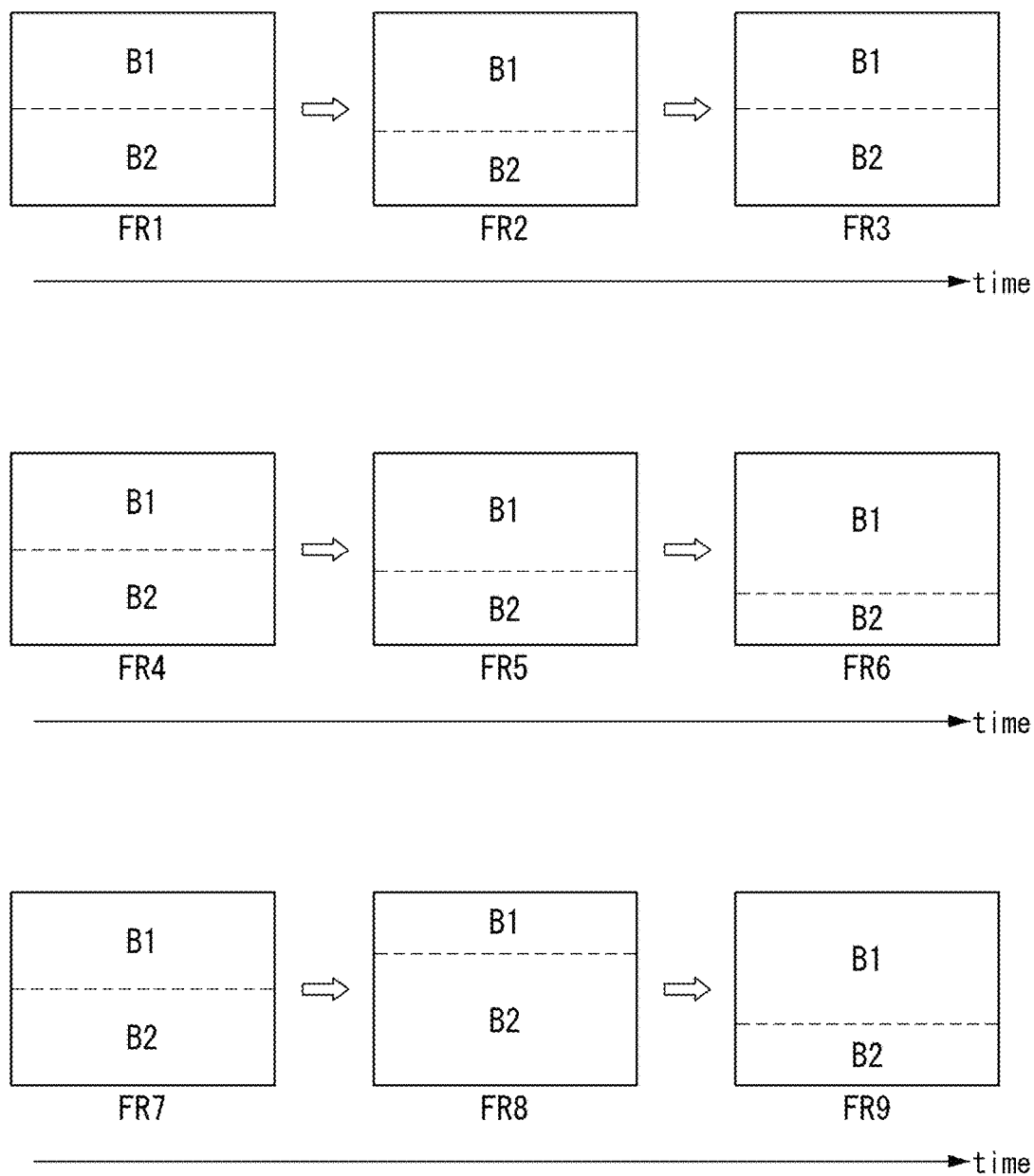
FIG. 11 illustrates an example where a boundary between blocks, which are time-division driven with a touch sensing period interposed therebetween, is shifted due to the shift of the touch sensing period and a display period.

FIGS. 10A and 10B illustrate an example where a touch sensing period and a display period are shifted every predetermined time. FIG. 11 illustrates an example where a boundary between blocks, which are time-division driven with a touch sensing period interposed therebetween, is shifted due to the shift of the touch sensing period and the display period.

Referring to FIGS. 10A and 10B, the display device according to the embodiment may shift touch sensing periods Tt1 and Tt2 and display periods Td2 and Td3 respectively following the touch sensing periods Tt1 and Tt2 every predetermined time. FIGS. 10A and 10B and FIG. 11 illustrate that the predetermined time is one frame period, by way of example. However, embodiments are not limited thereto. The touch sensing periods Tt1 and Tt2 and the display periods Td2 and Td3 may be variously modified depending on a distribution effect of a stress of pull-up transistors, a method of driving the display device, an application model of the display device, and the like.

In an example of FIG. 10A, the touch sensing periods Tt1 and Tt2 are shifted further down on the screen in a second frame period FR2 than in a first frame period FR1 and are returned to an original position in a third frame period FR3. In an example of FIG. 10B, the touch sensing periods Tt1 and Tt2 are shifted further down on the screen in the second frame period FR2 than in the first frame period FR1 and are shifted further down on the screen in the third frame period FR3 than in the second frame period FR2. A method of shifting the touch sensing periods Tt1 and Tt2 and the display periods Td2 and Td3 is not limited to FIGS. 10A and 10B and may use various methods.

When the touch sensing periods Tt1 and Tt2 and the display periods Td2 and Td3 are shifted, a boundary between blocks B1 and B2 of the screen, which are time-division driven with the touch sensing periods Tt1 and Tt2 interposed therebetween, is shifted. When the boundary between the blocks B1 and B2 is shifted every one frame period, it is difficult for a user to recognize a line dim phenomenon between the blocks B1 and B2. In FIG. 11, FR1 to FR9 are frame period numbers.

The shift register of the gate driver 104 sequentially outputs the gate pulses during the display period. The shift register temporarily stops an output in the touch sensing period Tt1 and then outputs again the gate pulse when a next display period is resumed. In each of two stages each outputting the gate pulse before and after the touch sensing period Tt1, a Q node is floated in a charged state, and a voltage of the Q node is kept charged with the gate high voltage VGH. As a result, a DC gate bias stress of pull-up transistors connected to the Q nodes of the stages outputting the gate pulse before and after the touch sensing period Tt1 increases.

Figure 12A:
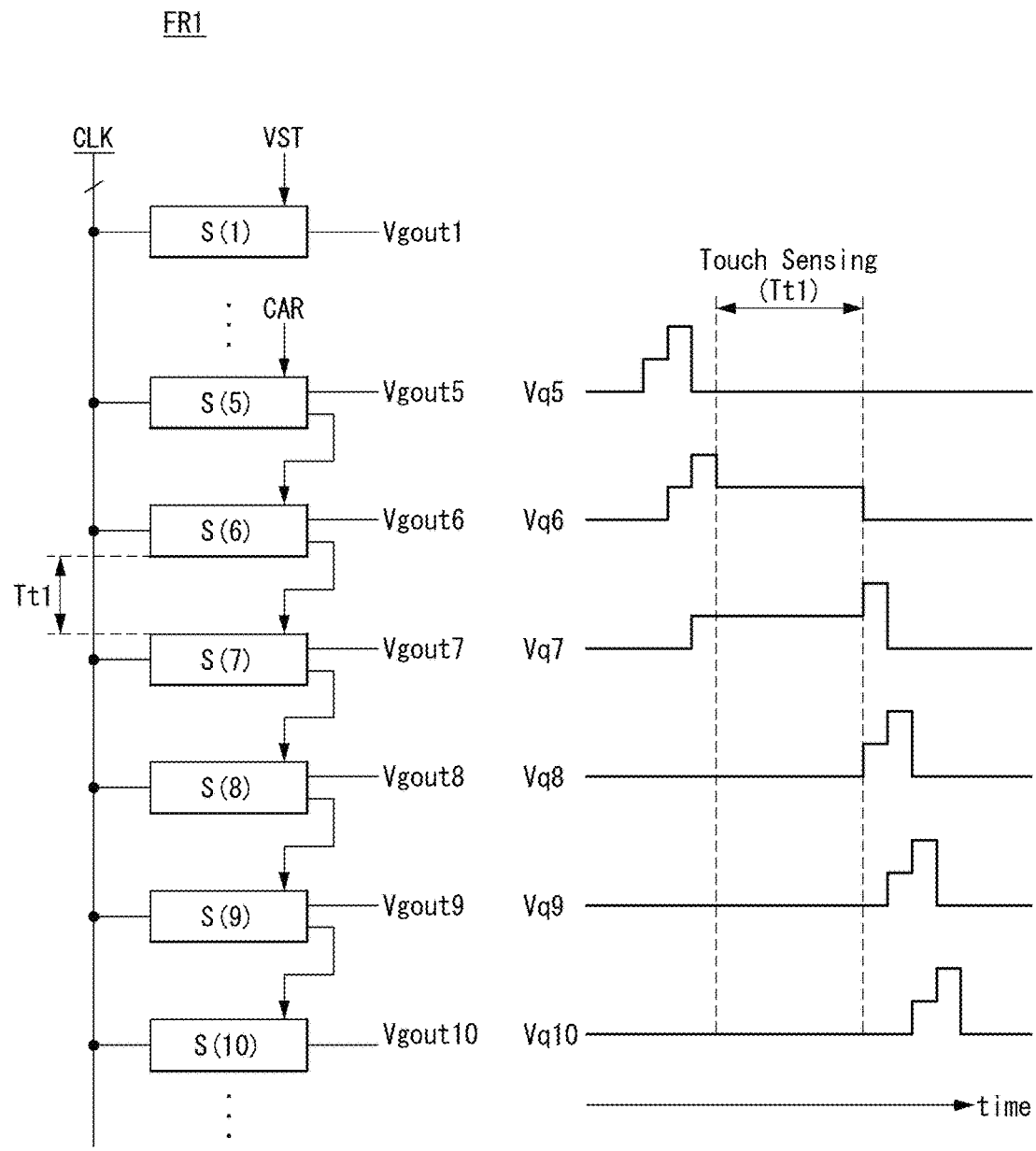
FIGS. 12A and 12B are waveform diagrams illustrating a voltage of a Q node of a shift register when a touch sensing period and a display period are shifted.
Figure 12B:
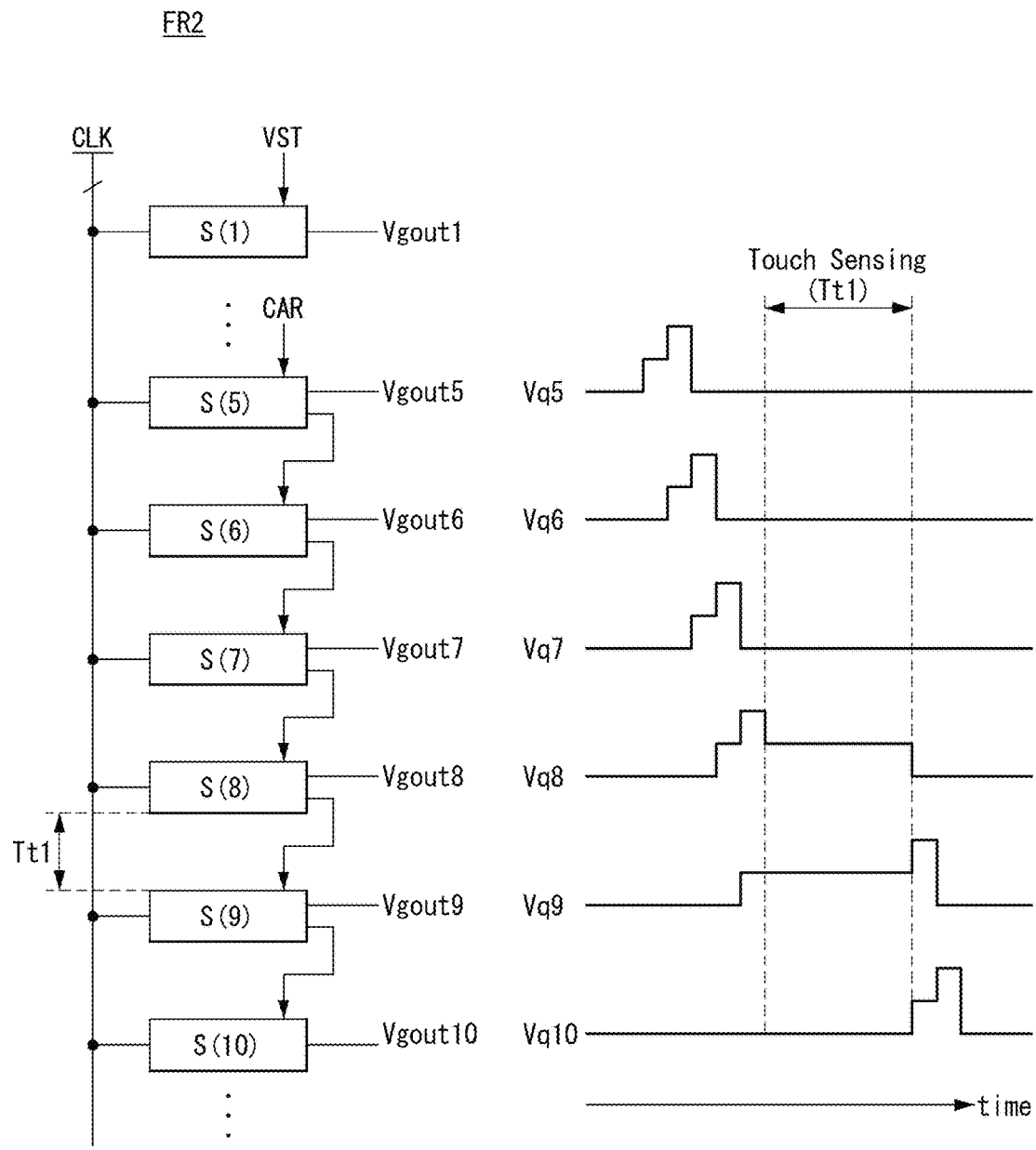

The display device according to the embodiment distributes the DC gate bias stress of the pull-up transistors to the plurality of stages by shifting the touch sensing periods Tt1 and Tt2 and the display periods Td2 and Td3 every predetermined time as shown in FIGS. 12A and 12B.

FIGS. 12A and 12B are waveform diagrams illustrating a voltage of a Q node of a shift register when a touch sensing period and a display period are shifted. In FIGS. 12A and 12B, S(1) to S(10) are stage numbers of the shift register, Vgout1 to Vgout10 are gate pulses sequentially output from stages, and "CAR" is a carry signal.

A Q node of a (N−1)th stage outputting a last gate pulse of a display period maintains a charged state during a touch sensing period, where N is a positive integer. Further, a Q node of a Nth stage outputting a first gate pulse of a next display period following the touch sensing period, maintains a charged state during the touch sensing period. As shown in FIGS. 12A and 12B, the (N−1)th stage and the Nth stage are changed to other stages every predetermined time, for example, every one frame period. For example, the (N−1)th stage and the Nth stage may be incremented to a next pair of stages, e.g., the (N+1)th stage and the (N+2)th stage, every one frame period.

Referring to FIG. 12A, a touch sensing period Tt1 exists between an output timing of a sixth stage S(6) and an output timing of a seventh stage S(7) in a first frame period FR1. In this instance, because a carry signal from a next stage is not input to the sixth stage S(6) through the VNEXT terminal during the touch sensing period Tt1, a Q node of the sixth stage S(6) is floated, is not discharged, and is maintained in a state charged with the gate high voltage VGH. Before the touch sensing period Tt1 starts, a Q node of the seventh stage S(7) is pre-charged due to a carry signal from the previous sixth stage S(6). During the touch sensing period Tt1, the Q node of the seventh stage S(7) is floated and maintained in a state charged with the gate high voltage VGH. Thus, in the first frame period FR1, a DC gate bias stress applied to pull-up transistors of the sixth and seventh stages S(6) and S(7) is increased due to the touch sensing period Tt1. On the other hand, pull-up transistors of other stages S(1) to S(5) and S(8) to S(10) are less stressed than the sixth and seventh stages S(6) and S(7) owing to a relatively short charge period of Q nodes.

In order to distribute the stress of the stages S(6) and S(7) positioned at a particular channel of the shift register, a touch sensing period Tt1 and a display period following the touch sensing period Tt1 are shifted in a second frame period FR2.

Referring to FIG. 12B, a touch sensing period Tt1 exists between an output timing of an eighth stage S(8) and an output timing of a ninth stage S(9) in the second frame period FR2. In this instance, Q nodes of the eighth and ninth stages S(8) and S(9) are maintained in a state charged with the gate high voltage VGH during the touch sensing period Tt1. Thus, in the second frame period FR2, a DC gate bias stress applied to pull-up transistors of the eighth and ninth stages S(8) and S(9) is increased due to the touch sensing period Tt1. On the other hand, pull-up transistors of other stages S(1) to S(7) and S(10) are less stressed than the eighth and ninth stages S(8) and S(9) owing to a relatively short charge period of Q nodes. Accordingly, the display device according to the embodiment shifts the touch sensing period Tt1 and a display period following the touch sensing period Tt1, thereby distributing a stress of pull-up transistors of the shift register of the gate driver 104 to the plurality of stages. Hence, the display device according to the embodiment can improve the reliability of the shift register. When the touch sensing period Tt1 is shifted from the viewpoint of a duty ratio, a duty ratio of the pull-up transistor connected to the Q node charged during the touch sensing period is reduced. Therefore, the DC gate bias stress of the pull-up transistor is reduced.

Figure 13:
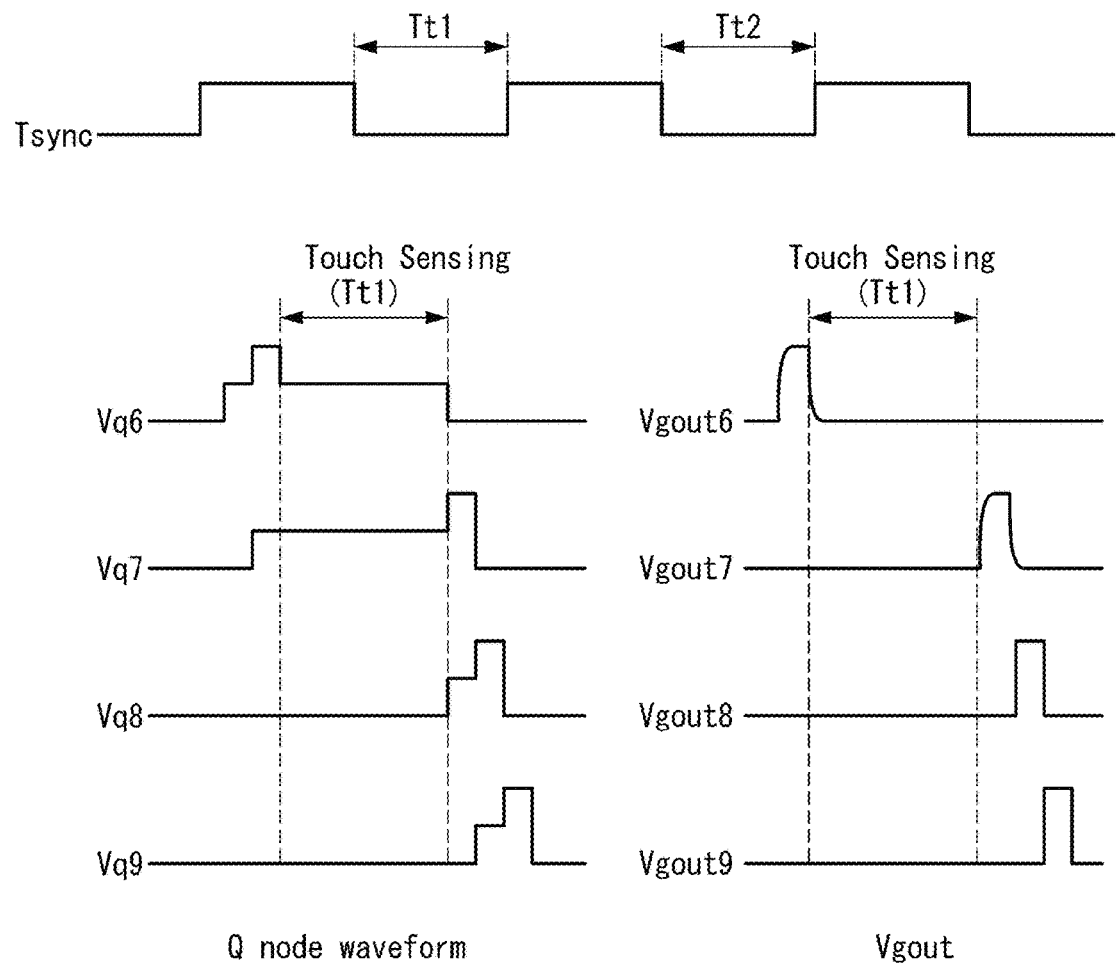
FIG. 13 illustrates a difference in a delay time between gate pulses resulting from a touch sensing period.

As shown in FIG. 13, when there is a large variation in the stress between the pull-up transistors, a difference in a delay time between the gate pulse generated in the display period and the gate pulse generated in the touch sensing period increases. Embodiments can uniformize a charge amount of the pixels of the entire screen by reducing the stress of the pull-up transistors and reducing a difference in the delay time between the gate pulses generated in the display period and the touch sensing period. As a result, embodiments can prevent the line dim from being seen at a boundary between the blocks which are time-division driven with the touch sensing period interposed therebetween.

Figure 14:
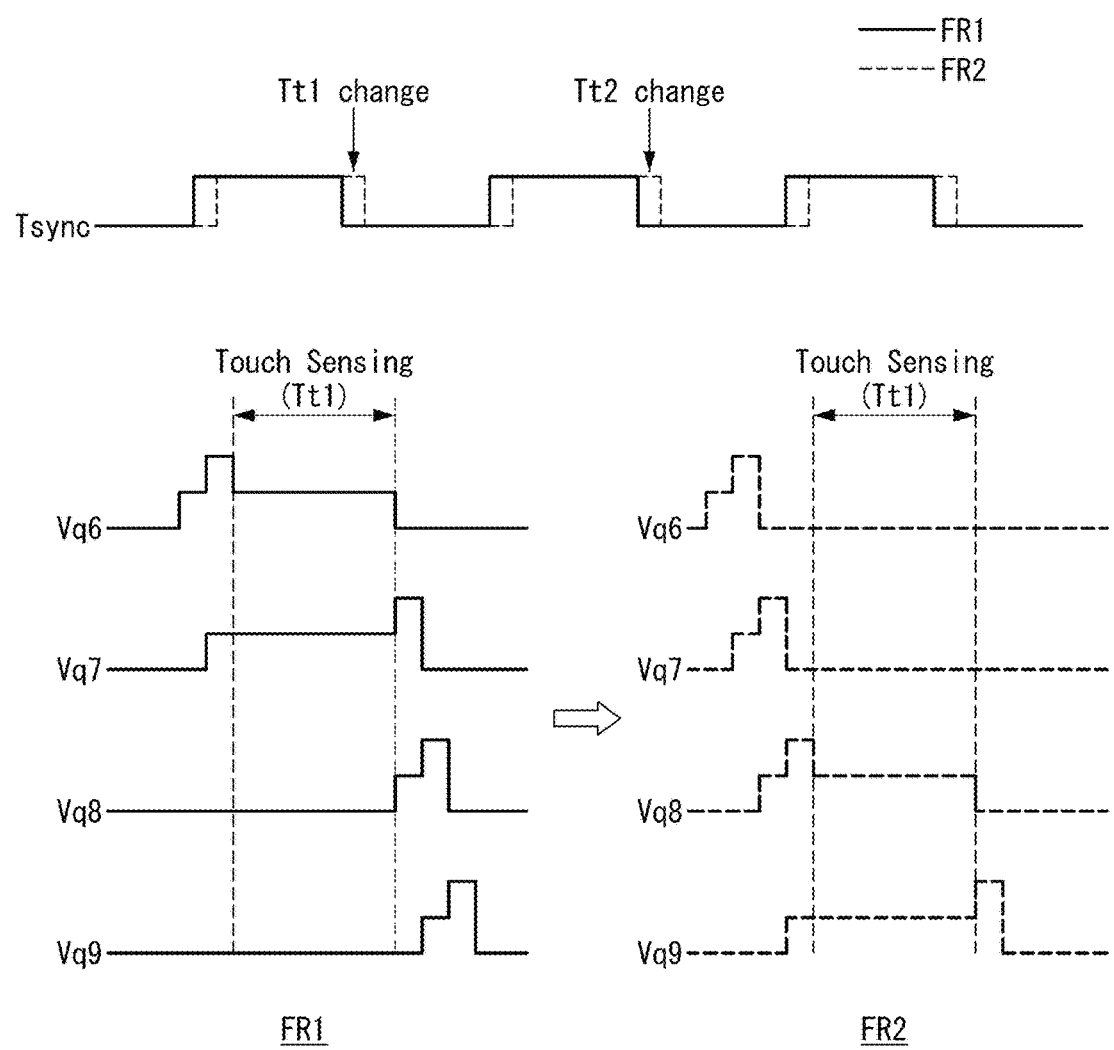
FIG. 14 is a waveform diagram illustrating a sync signal defining a display period and a touch sensing period and a change in a voltage of a Q node of a shift register when the sync signal is changed.

FIG. 14 is a waveform diagram illustrating a sync signal defining a display period and a touch sensing period and a change in a voltage of a Q node of a shift register when the sync signal is changed. In FIG. 14, Vq6 to Vq9 are voltages of Q nodes of sixth to ninth stages S(6) to S(9) of the shift register.

Referring to FIG. 14, the display device according to the embodiment may change a pulse timing of a sync signal Tsync every one frame period. A high level voltage period of the sync signal Tsync may be defined as the display period, and a low level voltage period of the sync signal Tsync may be defined as the touch sensing period, and vice versa. An edge timing of a pulse of the sync signal Tsync indicating a boundary between the display period and the touch sensing period is changed every predetermined time, for example, every one frame period. Thus, touch sensing periods Tt1 and Tt2 and display periods following the touch sensing periods Tt1 and Tt2 are shifted every one frame period due to the sync signal Tsync. As a result, a position of a stage, of which a Q node is charged during the touch sensing periods Tt1 and Tt2, is changed.

The display device according to the embodiment may dividedly operate in an idle mode and an active mode. When an input image is input for a predetermined time or when a touch input is detected within a predetermined reference time, the display device according to the embodiment operates in the active mode. Hence, the display device according to the embodiment displays data at a normal operation frame rate and transmits coordinates of the touch input to the host system at a high touch report rate by increasing the number of touch inputs sensed in one frame period.

On the other hand, when an input image is not input for a predetermined time and a touch input is not detected for a predetermined reference time, the display device according to the embodiment operates in the idle mode. Hence, the display device according to the embodiment reduces a frame rate and transmits coordinates of the touch input to the host system at a low touch report rate by reducing the number of touch inputs sensed in one frame period.

Figure 15:
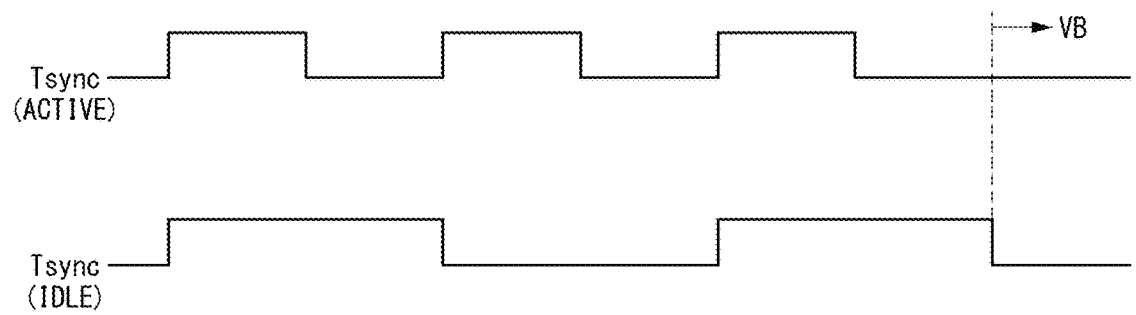
FIG. 15 is a waveform diagram illustrating that a sync signal is changed depending on an operation mode.

As shown in FIG. 15, the display device according to the embodiment distributes the stress applied to the pull-up transistors of the shift register to the plurality of stages by differently changing a cycle of the sync signal Tsync in the idle mode and the active mode. A cycle Tsync(ACTIVE) of the sync signal Tsync is shortened in the active mode, but a cycle Tsync(IDLE) of the sync signal Tsync is lengthened in the idle mode. When the cycle of the sync signal Tsync is shortened, the number of touch sensing periods in one frame period increases. Therefore, the number of touch inputs sensed increases, and the touch report rate increases. As described above, the timings of the touch sensing period and the display period may be variously changed in the active mode.

When the cycle of the sync signal Tsync is changed, a boundary between the display period and the touch sensing period is changed. Because of this, when the cycle of the sync signal Tsync is changed depending on the operation mode of the display device, the stress of the pull-up transistors is distributed to the plurality of stages without concentrating on the stage positioned at a particular channel of the shift register.

Figure 16:
FIG. 16 is a waveform diagram illustrating a sync signal generated in a finger touch mode.

The touch sensing unit 110 may dividedly operate in a pen touch mode and a finger touch mode based on a change in a capacitance of the touch sensor and sense a touch input. When the user touches the touch sensor with his/her finger, a change in the capacitance of the touch sensor in the finger touch is greater than that in the pen touch because of a large touch area of the finger touch. The touch sensing unit 110 may operate in the finger touch mode during a vertical blanking interval VB. In this instance, as shown in FIG. 16, in the finger touch mode, a period of the sync signal Tsync defining the touch sensing period exists in the vertical blanking interval VB.

Because there is no input image data in the vertical blanking interval VB, the vertical blanking interval VB may be used as the touch sensing period without having the display period. Thus, because there is no output of the shift register in the finger touch mode, there is no stress of the shift register.

The touch sensing unit 110 may operate in the pen touch mode during a vertical active period AT, in which input image data is input to the display device, and sense a touch input. In the pen touch mode, the sync signal Tsync may be changed in various methods as in the above-described embodiments and may shift the touch sensing period and the display period on a time axis. In the vertical active period AT, the touch sensing period and the display period following the touch sensing period are changed every predetermined time.

Figure 17:
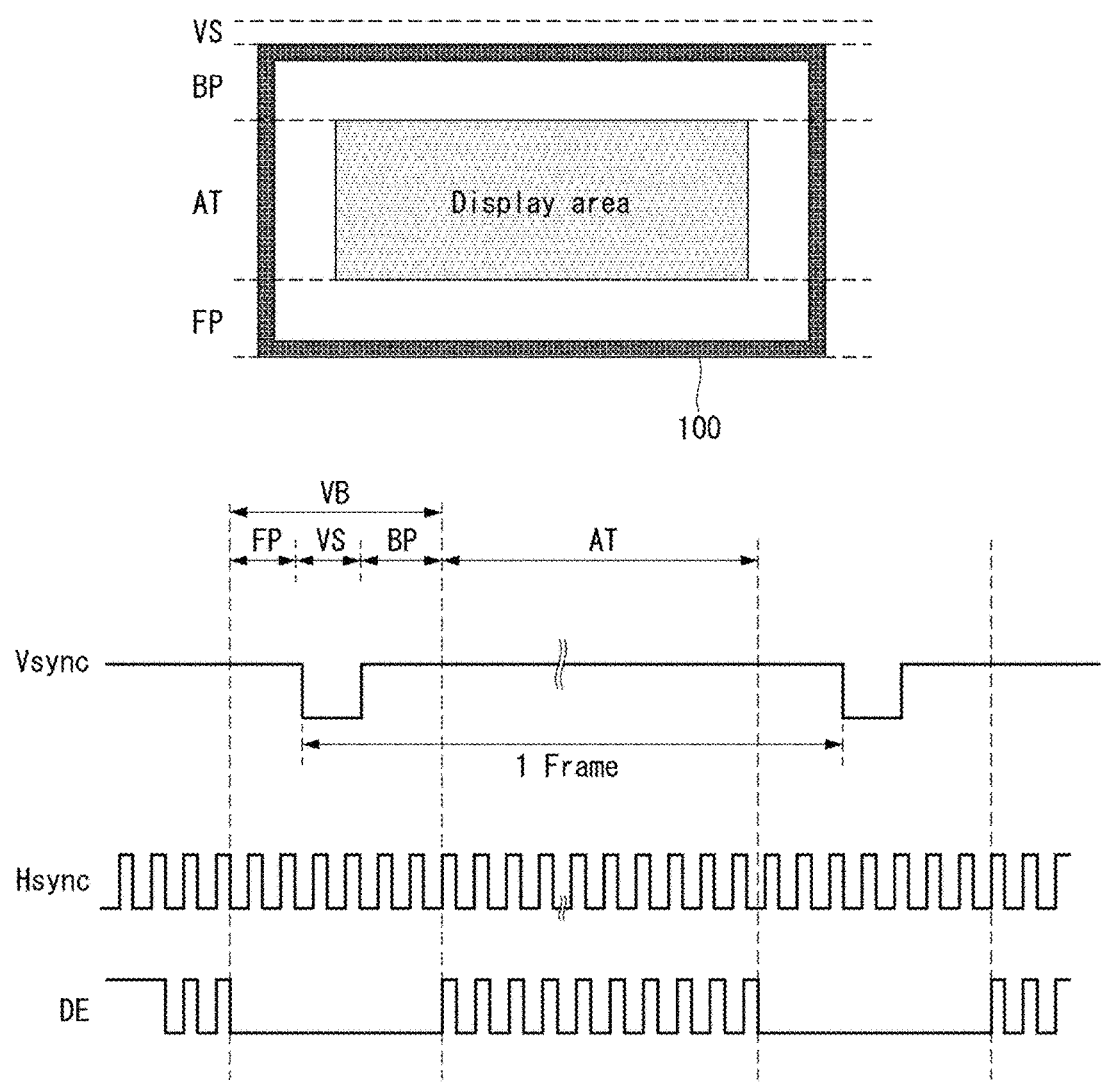
FIG. 17 illustrates in detail one frame period.

A vertical blanking interval VB is described below with reference to FIG. 17 illustrating a display timing of a video electronics standards association (VESA) standard.

Referring to FIG. 17, a vertical sync signal Vsync defines one frame period, and a horizontal sync signal Hsync defines one horizontal period. A data enable signal DE defines an effective data period. The data enable signal DE is synchronized with effective data to be displayed on the pixel array of the display panel 100. One pulse cycle of the data enable signal DE is one horizontal period, and a high logic period of the data enable signal DE indicates an input timing of data of one line. One horizontal period is time required to write data to pixels on one line of the display panel 100.

One frame period is divided into one vertical active period AT and one vertical blanking interval VB. The data enable signal DE and effective data of an input image are input during the vertical active period AT and are not input in the vertical blanking interval VB. The vertical active period AT is time required to write data corresponding to one frame to all the pixels of the pixel array of the display panel 100 on which an image is displayed.

As can be seen from the data enable signal DE, no input data is received on the display device during the vertical blanking interval VB. The vertical blanking interval VB includes a vertical sync time VS, a vertical front porch FP, and a vertical back porch BP. The vertical sync time VS is time from a falling edge to a rising edge of the vertical sync signal Vsync and indicates a start timing (or an end timing) of one screen. The vertical front porch FP is time from a falling edge of a last pulse of the data enable signal DE indicative of a last line data timing of one frame data to a start of the vertical blanking interval VB. The vertical back porch BP is time from an end of the vertical blanking interval VB to a rising edge of a first pulse of the data enable signal DE indicative of a first line data timing of one frame data.

As described above, embodiments change the touch sensing period and the display period every predetermined time and distribute a stress of the pull-up transistors of the shift register of the gate driver outputting the gate pulse to the plurality of stages. Hence, embodiments can improve the reliability of the gate driver and increase the lifespan of the gate driver. As a result, embodiments can improve the image quality of the display device, to which the in-cell touch sensor technology is applied, by preventing a reduction (for example, the line dim) in the image quality.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
    a display panel divided into a plurality of blocks, each of the blocks including a plurality of lines of pixels and configured to be driven in a time-division manner with a touch sensing period interposed between two display periods, the two display periods corresponding to display periods for two adjacent blocks of the plurality of blocks;
    a display driving circuit; and
    touch sensing circuitry configured to receive a sync signal for synchronizing the display driving circuit with the touch sensing circuitry,
    wherein the display device is configured to change the sync signal every predetermined period of time so as to shift the touch sensing period interposed between the two display periods,
    wherein the display driving circuit includes a shift register configured to shift a gate pulse in accordance with a shift clock and sequentially supply the gate pulse to the gate lines, the shift register including a plurality of stages,
    wherein each of the stages of the shift register includes a Q node configured to control pull up transistor increasing a voltage of the gate pulse,
    wherein a Q node of a (N−1)th stage outputting a last gate pulse of the first display period maintains a charged state during the touch sensing period, where N is a positive integer,
    wherein a Q node of an Nth stage outputting a first gate pulse of the second display period maintains a charged state during the touch sensing period, and
    wherein the (N−1)th stage and the Nth stage are incremented to a next pair of stages every predetermined period of time.

2. The display device of claim 1, further comprising a timing controller configured to generate the sync signal and supply the sync signal to the touch sensing circuitry.

3. The display device of claim 1, wherein the predetermined period of time is one frame period.

4. The display device of claim 3, wherein each frame period includes a touch sensing period interposed between two display periods, a beginning of the touch sensing period of a second frame period that follows a first frame period is shifted to a later point in time compared to a beginning of the touch sensing period in the first frame period, and
    a beginning of the touch sensing period of a third frame period that follows the second frame period corresponds to the beginning of the touch sensing period in the first frame period.

5. The display device of claim 3, wherein each frame period includes a touch sensing period interposed between two display periods, a beginning of the touch sensing period of a second frame period that follows a first frame period is shifted to a later point in time compared to a beginning of the touch sensing period in the first frame period, and a beginning of the touch sensing period of a third frame period that follows the second frame period is shifted to a later point in time compared to the beginning of the touch sensing period in the second frame period.

6. The display device of claim 1, wherein each stage of the shift register further includes a QB node configured to control a pull-down transistor, and a controller configured to control a charge and a discharge of the Q node and the QB node.

7. The display device of claim 6, wherein each stage is configured to pre-charge the Q control node in response to a start signal input to a start signal input terminal of the stage or a carry signal received from a previous stage, and to increase a voltage of an output terminal of the stage to a gate high voltage when a shift clock is input, thereby starting to output the gate pulse.

8. The display device of claim 7, wherein, as a result of the changing of the sync signal, a position of a stage, of which the Q node is charged during the touch sensing period, is changed every predetermined period of time.

9. The display device of claim 8, wherein each stage comprises a discharge blocking circuit configured to charge a discharge blocking node positioned in a discharge path of the Q node during a charge period of the Q node to block the discharge path of the Q node and discharge the discharge blocking node during a discharge period of the Q node to form the discharge path of the Q node.

10. A display device comprising:
a display panel including pixels connected to data lines and gate lines and time-division driven in a plurality of blocks and a plurality of touch sensors connected to the pixels;
a display driving circuit configured to write data of an input image to the pixels in first and second display periods which are separated from each other by a touch sensing period interposed therebetween in one frame period; and
touch sensing circuitry configured to drive the touch sensors in the touch sensing period, in response to a sync signal, and sense a touch input,
wherein the touch sensing period and the second display period following the touch sensing period are changed every predetermined period of time,
wherein the display driving circuit includes a shift register configured to shift a gate pulse in accordance with a shift clock and sequentially supply the gate pulse to the gate lines, the shift register including a plurality of stages,
wherein each of the stages of the shift register includes a Q node configured to control a pull up transistor increasing a voltage of the gate pulse,
wherein a Q node of a (N−1)th stage outputting a last gate pulse of the first display period maintains a charged state during the touch sensing period, where N is a positive integer,
wherein a Q node of an Nth stage outputting a first gate pulse of the second display period maintains a charged state during the touch sensing period, and
wherein the (N−1)th stage and the Nth stage are incremented to a next pair of stages every predetermined period of time.

11. The display device of claim 10, further comprising a timing controller that generates the sync signal and provides the sync signal to the touch sensing circuitry.

12. The display device of claim 10, wherein the sync signal defines the first and second display periods and the touch sensing period, and
wherein an edge timing of a pulse of the sync signal indicating boundaries between the first and second display periods and the touch sensing period is changed every predetermined period of time.

13. The display device of claim 12, wherein the predetermined period of time is one frame period.

14. The display device of claim 10, wherein each stage of the shift register further includes a first transistor configured to charge the Q node in response to a start signal or an output signal of a previous stage, and a second transistor configured to switch on and off a discharge path of the Q node in response to an output signal of a next stage, and
wherein at least one of the stages includes:
a discharge blocking node connected between a low potential voltage terminal supplied with a low potential power voltage and the second transistor; and
a discharge blocking circuit configured to charge the discharge blocking node when the Q node is charged and discharge the discharge blocking node when the Q node is discharged.

15. The display device of claim 12, wherein a cycle of the sync signal in an idle mode of the display device is longer than a cycle of the sync signal in an active mode of the display device.

16. The display device of claim 10, wherein the touch sensing circuitry dividedly operates in a pen touch mode and a finger touch mode,
wherein the touch sensing circuitry operates in the finger touch mode in a vertical blanking interval, and
wherein the touch sensing period and the second display period are changed every predetermined period of time in a vertical active period.

* * * * *